(12) United States Patent
Hsu et al.

(10) Patent No.: US 11,257,928 B2
(45) Date of Patent: Feb. 22, 2022

(54) METHOD FOR EPITAXIAL GROWTH AND DEVICE

(71) Applicant: Taiwan Semiconductor Manufacturing Company, Ltd., Hsinchu (TW)

(72) Inventors: Tzu-Hsiang Hsu, Xinfeng Township (TW); Ting-Yeh Chen, Hsinchu (TW); Wei-Yang Lee, Taipei (TW); Feng-Cheng Yang, Zhudong Township (TW); Yen-Ming Chen, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 63 days.

(21) Appl. No.: 16/682,305

(22) Filed: Nov. 13, 2019

(65) Prior Publication Data
US 2020/0168723 A1  May 28, 2020

Related U.S. Application Data

(60) Provisional application No. 62/771,847, filed on Nov. 27, 2018.

(51) Int. Cl.
| | |
|---|---|
| *H01L 29/66* | (2006.01) |
| *H01L 27/11* | (2006.01) |
| *H01L 27/092* | (2006.01) |
| *H01L 29/06* | (2006.01) |
| *H01L 29/08* | (2006.01) |
| *H01L 29/165* | (2006.01) |
| *H01L 29/78* | (2006.01) |
| *H01L 21/02* | (2006.01) |

(Continued)

(52) U.S. Cl.
CPC .. *H01L 29/66636* (2013.01); *H01L 21/02507* (2013.01); *H01L 21/02532* (2013.01); *H01L 21/3065* (2013.01); *H01L 21/764* (2013.01); *H01L 21/823814* (2013.01); *H01L 21/823821* (2013.01); *H01L 21/823878* (2013.01); *H01L 27/0924* (2013.01); *H01L 27/1104* (2013.01); *H01L 27/1116* (2013.01); *H01L 29/0653* (2013.01); *H01L 29/0847* (2013.01); *H01L 29/165* (2013.01); *H01L 29/66545* (2013.01); *H01L 29/7848* (2013.01)

(58) Field of Classification Search
CPC ......... H01L 29/66636; H01L 21/02507; H01L 21/02532
See application file for complete search history.

(56) References Cited

U.S. PATENT DOCUMENTS 8,962,400 B2   2/2015  Tsai et al.
9,093,514 B2   7/2015  Tsai et al.
(Continued)

*Primary Examiner* — Errol V Fernandes
(74) *Attorney, Agent, or Firm* — Slater Matsil, LLP

(57) ABSTRACT

A semiconductor device includes first and second semiconductor fins extending from a substrate and a source/drain region epitaxially grown in recesses of the first and second semiconductor fins. A top surface of the source/drain region is higher than a surface level with top surfaces of the first and second semiconductor fins. The source/drain region includes a plurality of buffer layers. Respective layers of the plurality of buffer layers are embedded between respective layers of the source/drain region. Each of the plurality of buffer layers may have an average thickness in a range of about 2 Å to about 30 Å.

20 Claims, 37 Drawing Sheets

(51) Int. Cl.
    *H01L 21/3065*     (2006.01)
    *H01L 21/764*     (2006.01)
    *H01L 21/8238*     (2006.01)

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 9,812,363 B1 | 11/2017 | Liao et al. |
| 9,859,380 B2 | 1/2018 | Lee et al. |
| 2008/0197412 A1 | 8/2008 | Zhang et al. |
| 2009/0108308 A1 | 4/2009 | Yang et al. |
| 2011/0062498 A1 | 3/2011 | Yang et al. |
| 2013/0026538 A1 | 1/2013 | Liao et al. |
| 2014/0134814 A1* | 5/2014 | Wong .............. H01L 21/823431 438/283 |
| 2015/0187940 A1 | 7/2015 | Huang et al. |
| 2016/0027918 A1* | 1/2016 | Kim ................... H01L 29/7834 257/401 |
| 2017/0186748 A1 | 6/2017 | Lee et al. |
| 2019/0097006 A1* | 3/2019 | Li ................... H01L 21/823431 |

* cited by examiner

METHOD FOR EPITAXIAL GROWTH AND DEVICE

PRIORITY CLAIM AND CROSS-REFERENCE

This application claims the benefit of U.S. Provisional Application No. 62/771,847, filed on Nov. 27, 2018, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

FinFETs are increasingly employed in the manufacture of integrated circuits, owing to the small size and high performance of the FinFET transistor. Fully strained channels further improve FinFET performance, but fully strained channel architectures create their own shortcomings to be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
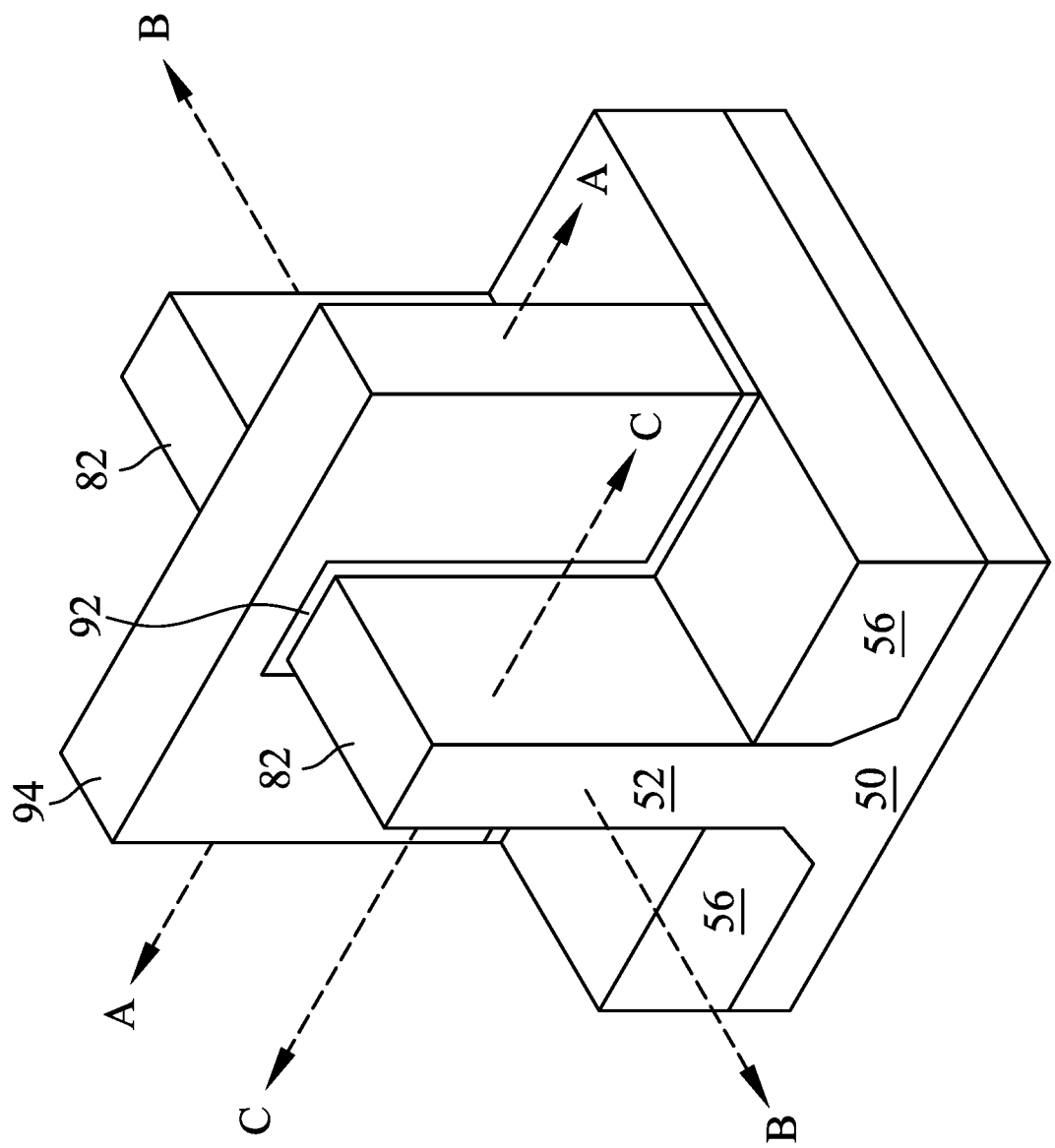
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Advantageous features of one or more embodiments disclosed herein includes a process for a multi-cycle epitaxial growth of source/drain regions. The multi-cycle growth uses a repeated deposition and etching (referred to henceforth as a dep-etch) to restrain horizontal growth of the source-drain regions and increase the height of the source/drain regions. Restraining the horizontal growth can prevent merging of adjacent source/drain regions used in the fabrication of static random access memory (SRAM) devices.

The multi-cycle dep-etch growth of the source/drain regions increases the height of the source/drain regions. Top surfaces of the source/drain regions may be higher than top surfaces of semiconductor fins in which the source/drain regions are epitaxially grown. The multi-cycle dep-etch growth process also improves critical dimension uniformity (CDU) of the source/drain regions and increases the total volume of the source/drain regions. Higher top surfaces of the source/drain regions and increased volume can lead to improved device performance by providing a larger volume of source/drain region for the metal contact to electrically couple with, decreasing contact resistance.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 23B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, 16A, 17A, 18A, 19A, 20A, 21A, 22A, and 23A are illustrated along reference cross-section A-A illustrated in FIG. 1, and FIGS. 8B, 9B, 10B, 11B, 12B, 13B, 14B, 15B, 16B, 17B, 18B, 19B, 20B, 21B, 21C, 22B, and 23B are illustrated along a similar cross-section B-B illustrated in FIG. 1, except for multiple fins/FinFETs. FIGS. 11C, 12C, 12D, 13C, 13D, 14C, 14D, 15C, 15D, 16C, 16D, 16C, 16D, 17C, and 17D are illustrated along reference cross-section C-C illustrated in FIG. 1, except for multiple fins/FinFETs.

Figure 2:
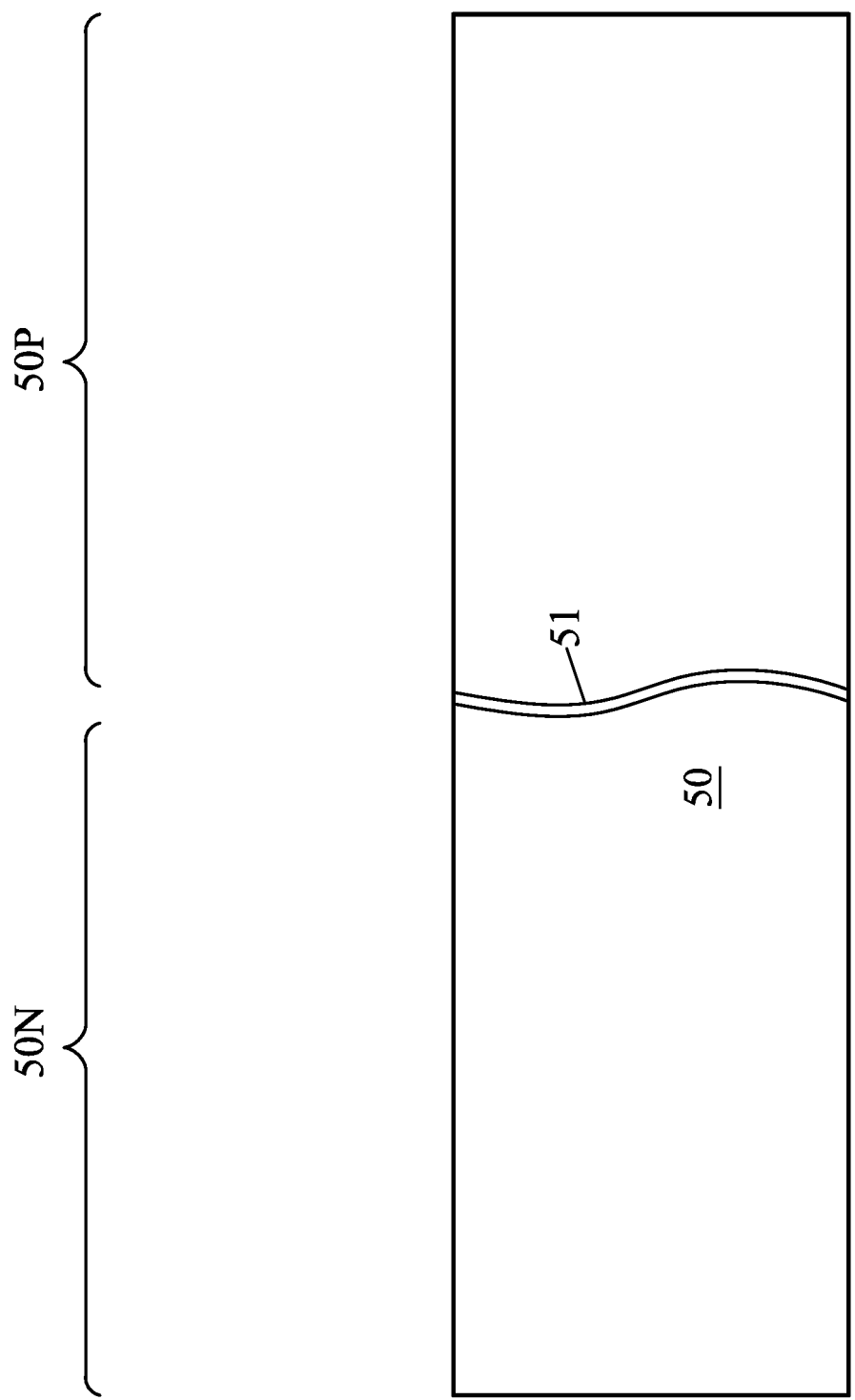
FIGS. 2-23B are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
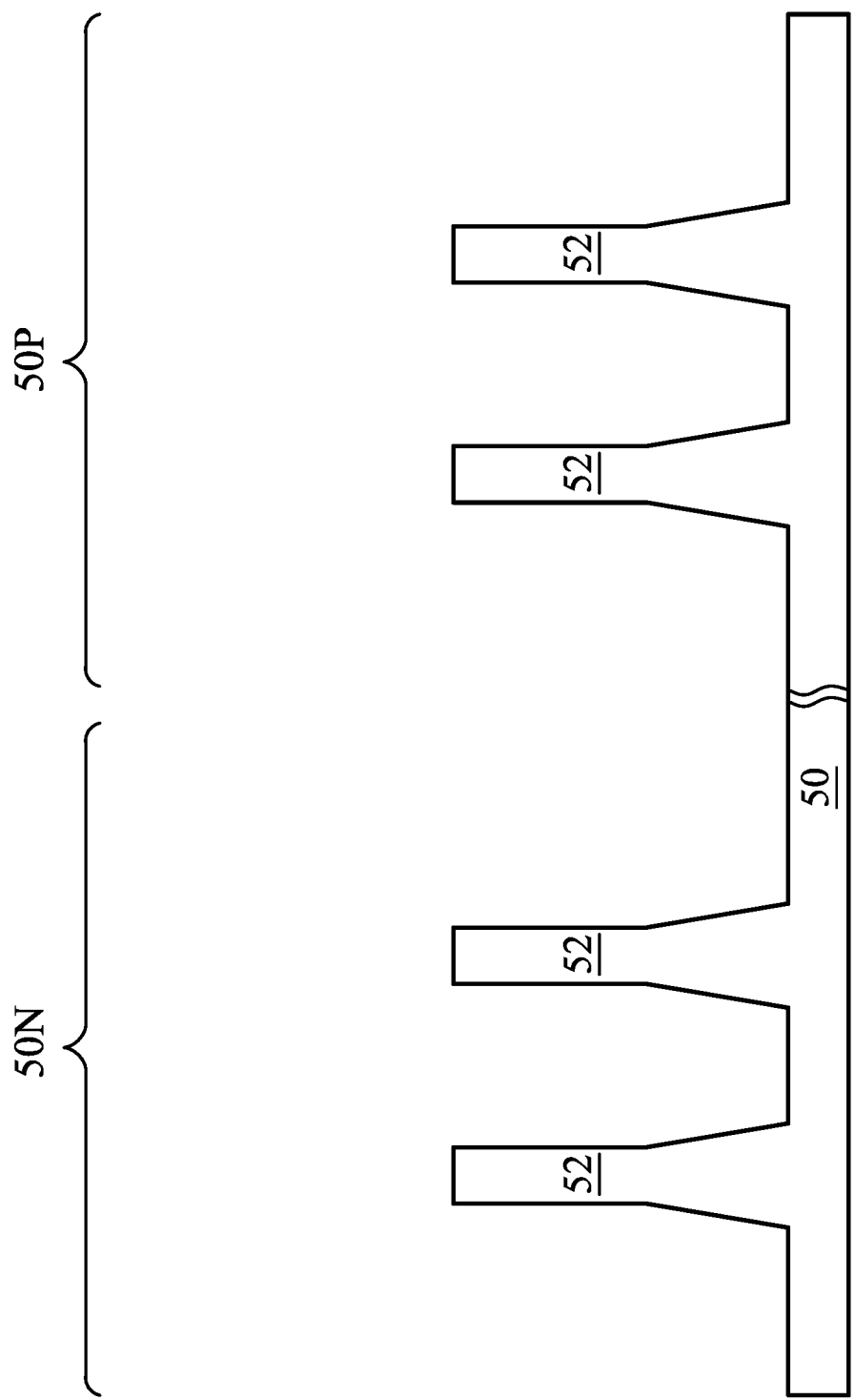

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
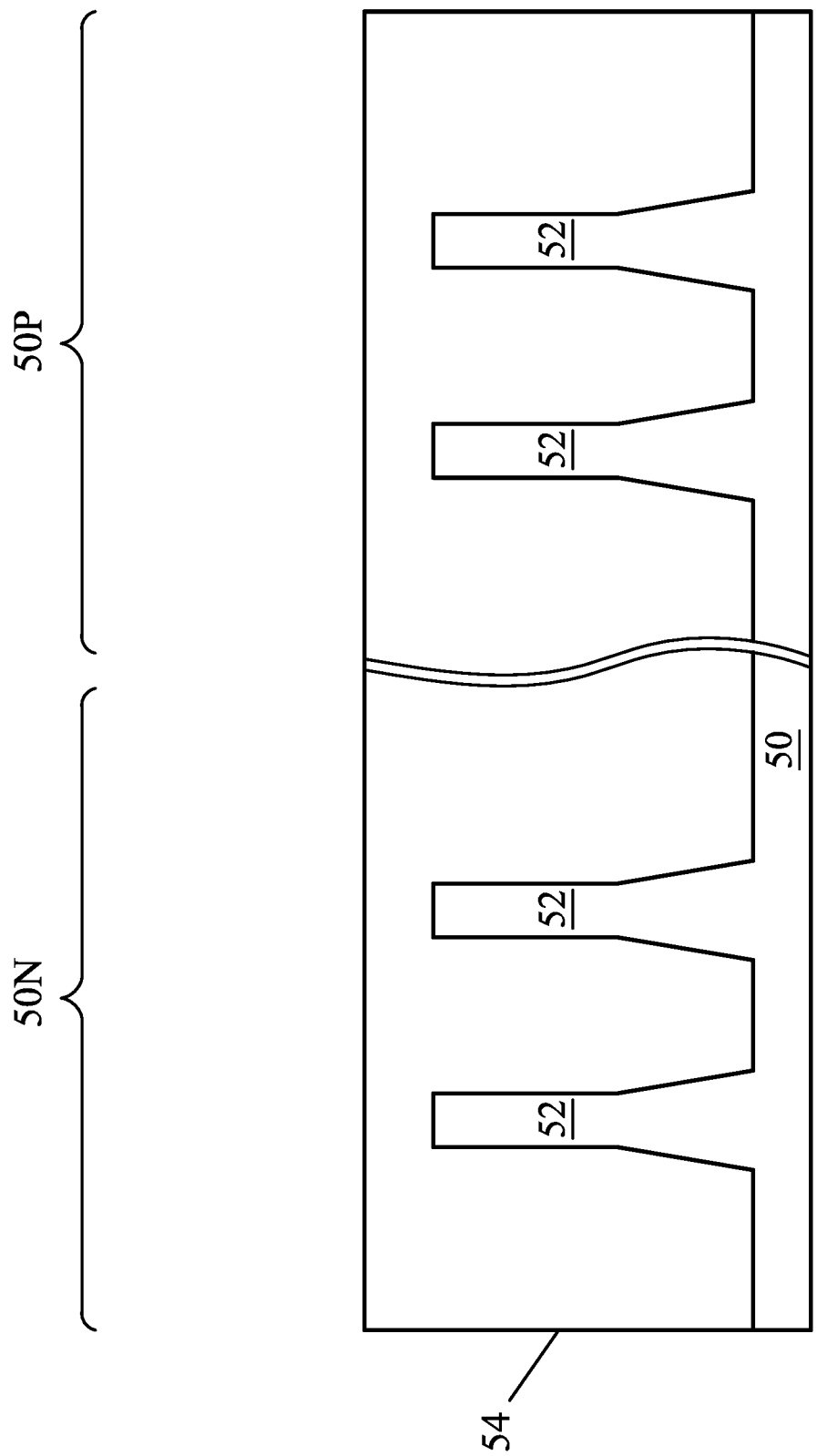

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
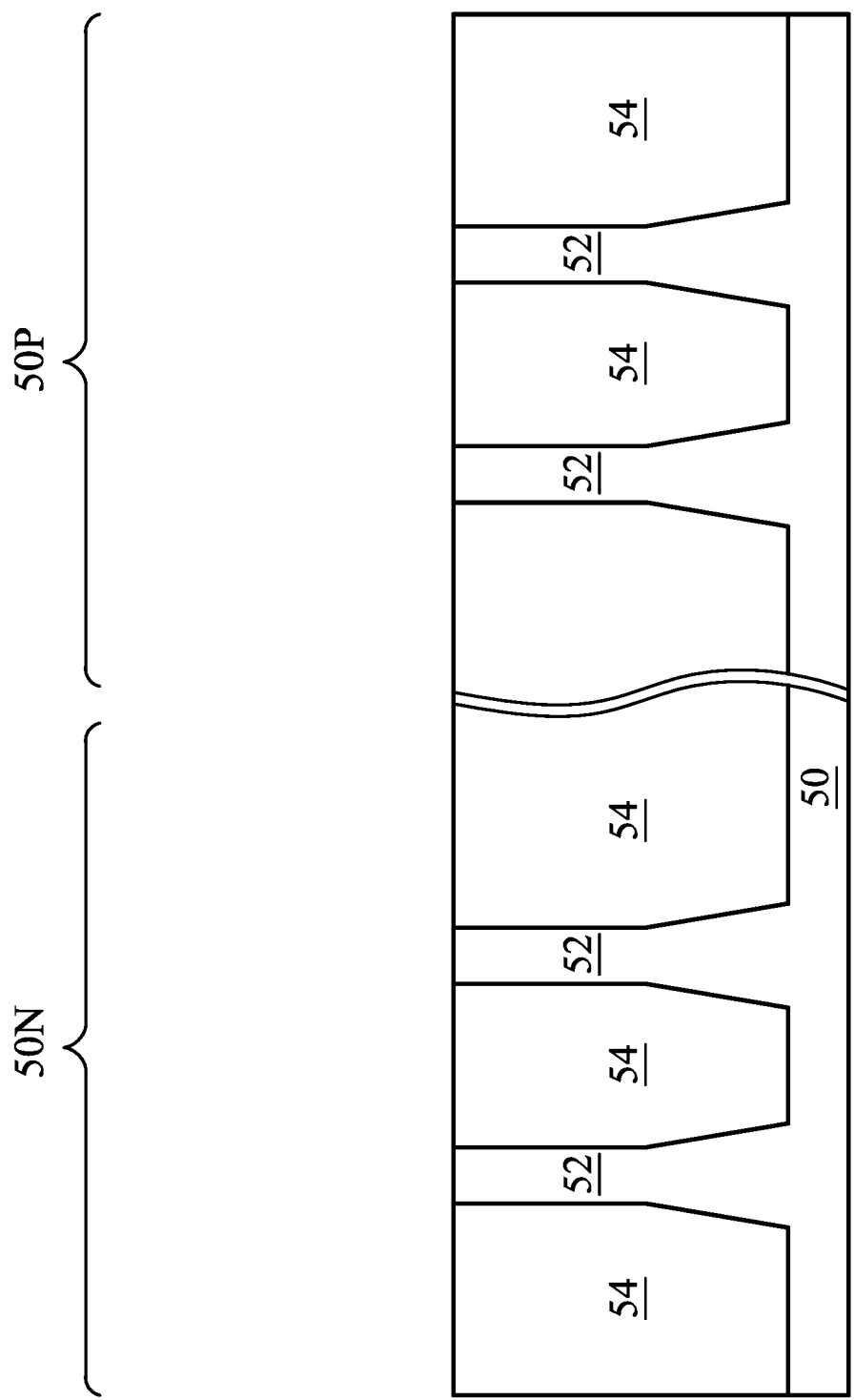

In FIG. 5, a removal process is applied to the insulation material 54 to remove excess insulation material 54 over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material 54 are level after the planarization process is complete.

Figure 6:
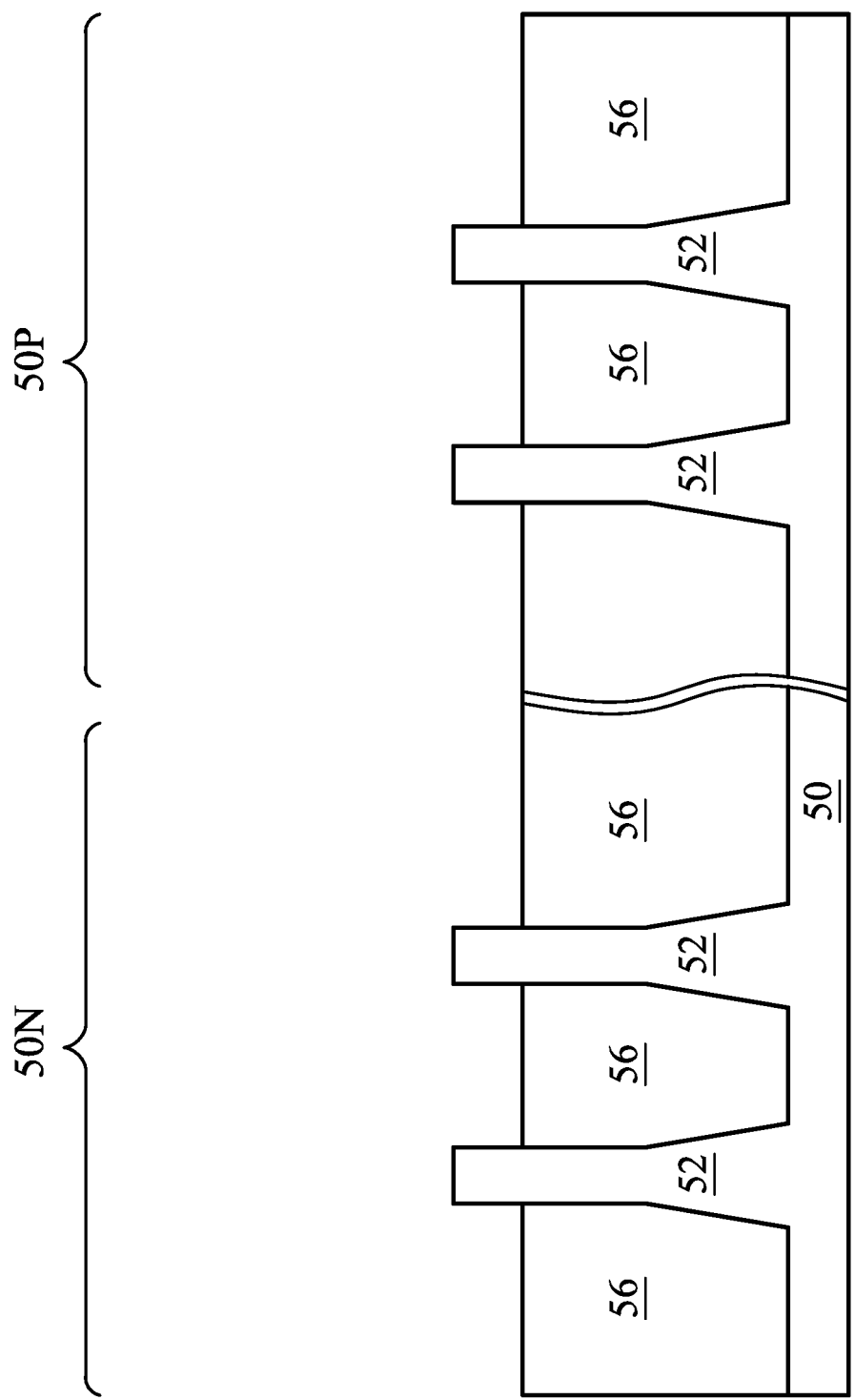

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, or the like implanted in the region to a concentration of equal to or less than $10^{18}$ cm$^{-3}$, such as in a range of about $10^{17}$ cm$^{-3}$ to about $10^{18}$ cm$^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, BF$_2$, or the like implanted in the region to a concentration of equal to or less than $10^{18}$ cm$^{-3}$, such as in a range of about $10^{17}$ cm$^{-3}$ to about $10^{18}$ cm$^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
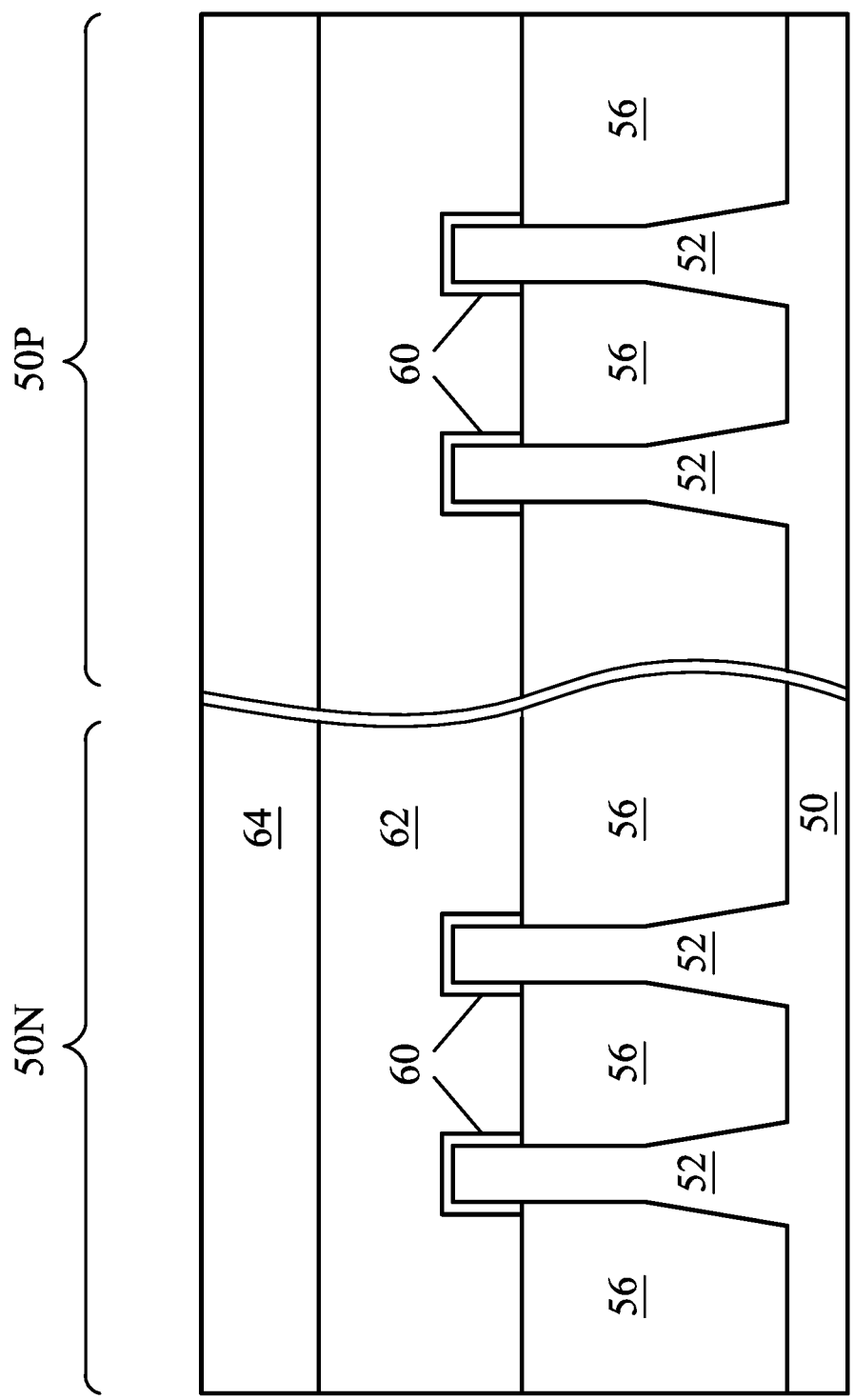

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. In some embodiments, separate dummy gate layers may be formed in the region 50N and the region 50P, and separate mask layers may be formed in the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 23B illustrate various additional steps in the manufacturing of embodiment devices. FIGS. 8A through 23B illustrate features in either of the region 50N and the region 50P. For example, the structures illustrated in FIGS. 8A through 23B may be applicable to both the region 50N and the region 50P. Differences (if any) in the structures of the region 50N and the region 50P are described in the text accompanying each figure.

Figure 8B:
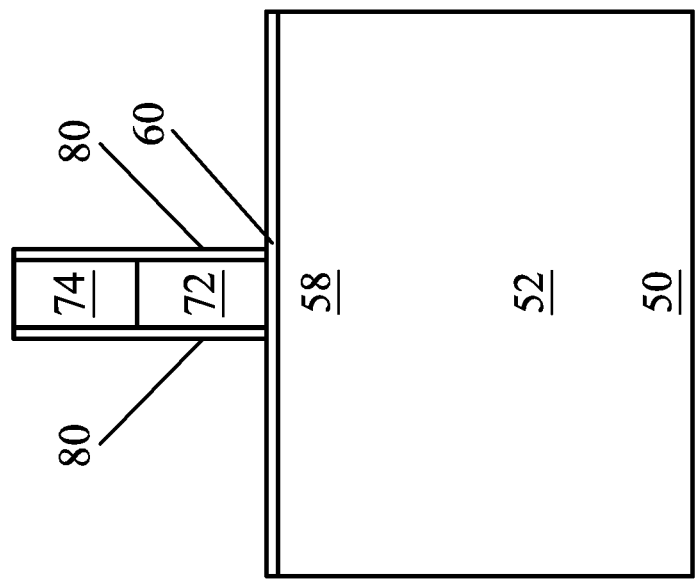
Figure 8A:
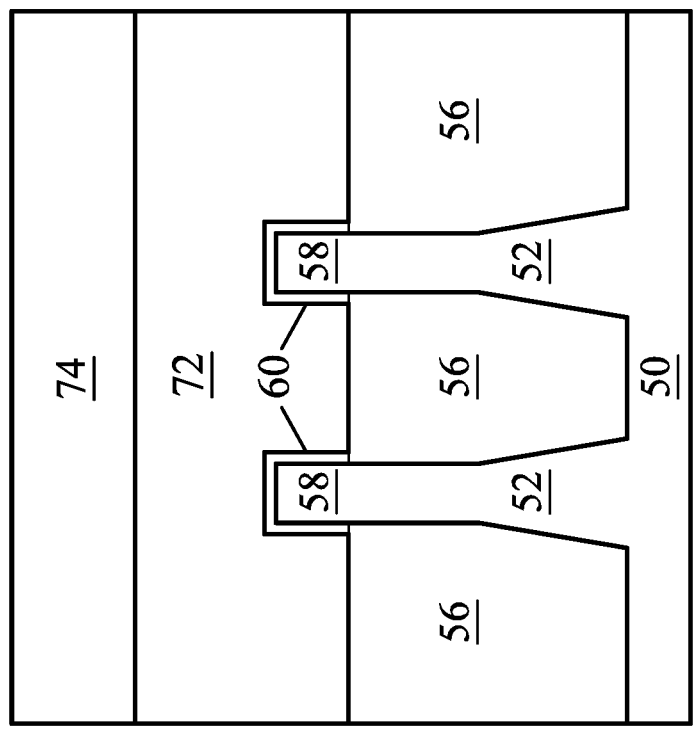

In FIGS. 8A and 8B, the mask layer 64 may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further, in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., n-type or p-type) impurities may be implanted into the exposed fins 52 in the region 50P. The mask may then be removed. Subsequently, a mask, such as a photoresist, may be formed over the region 50P while exposing the region 50N, and appropriate type impurities may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 9B:
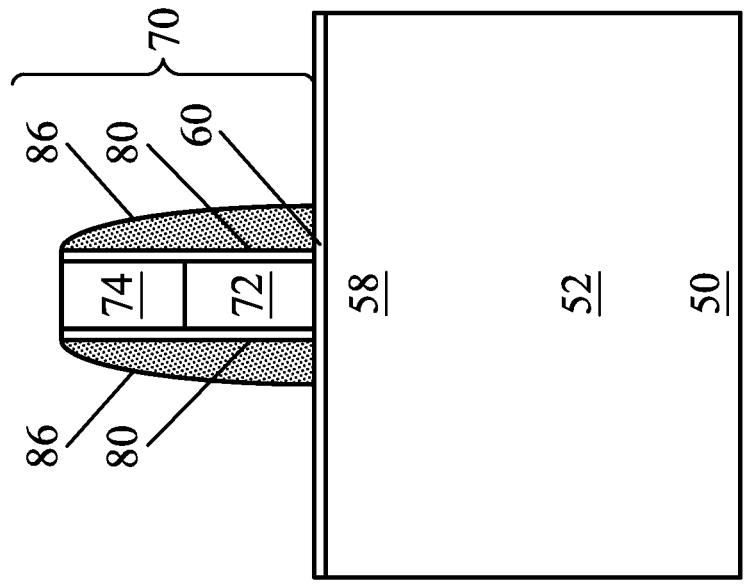
Figure 9A:
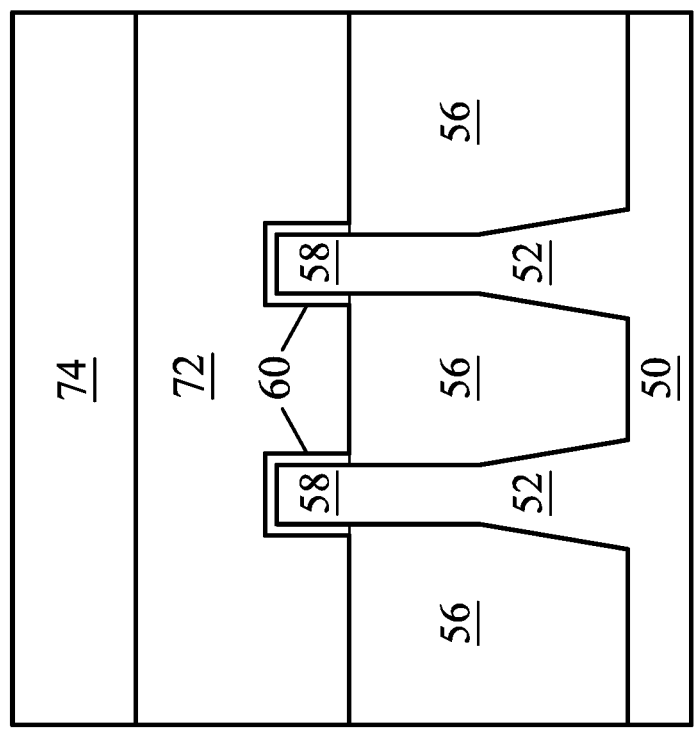

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon nitride, SiCN, a combination thereof, or the like. The gate spacers 86 may comprise a plurality of layers. The layers of the gate spacers 86 may also comprise different materials. The anisotropic etching process may not fully remove horizontal portions of the gate spacers 86 from the isolation regions 56 between adjacent fins 52. In such embodiments, top surfaces of the isolation regions 56 between adjacent fins 52 are covered by unremoved horizontal portions of the gate spacers 86. The dummy gates 72, the masks 74, and the gate spacers 86 comprise gate assemblies 70.

Figure 10B:
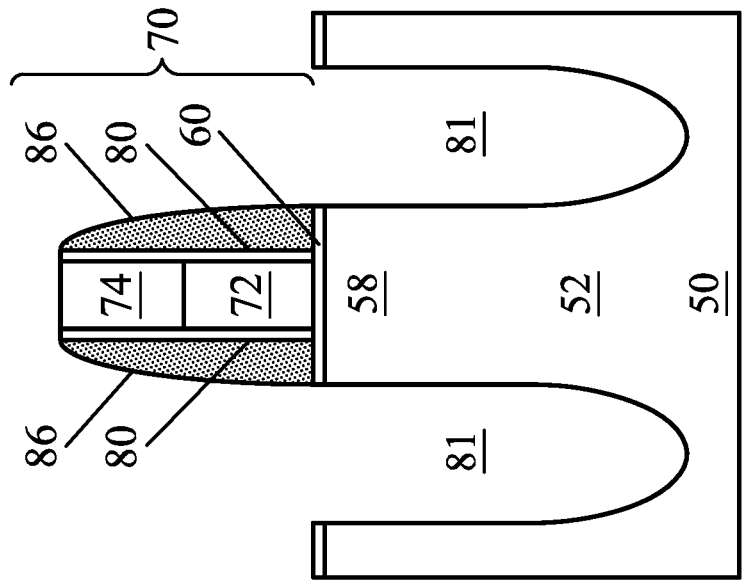
Figure 10A:
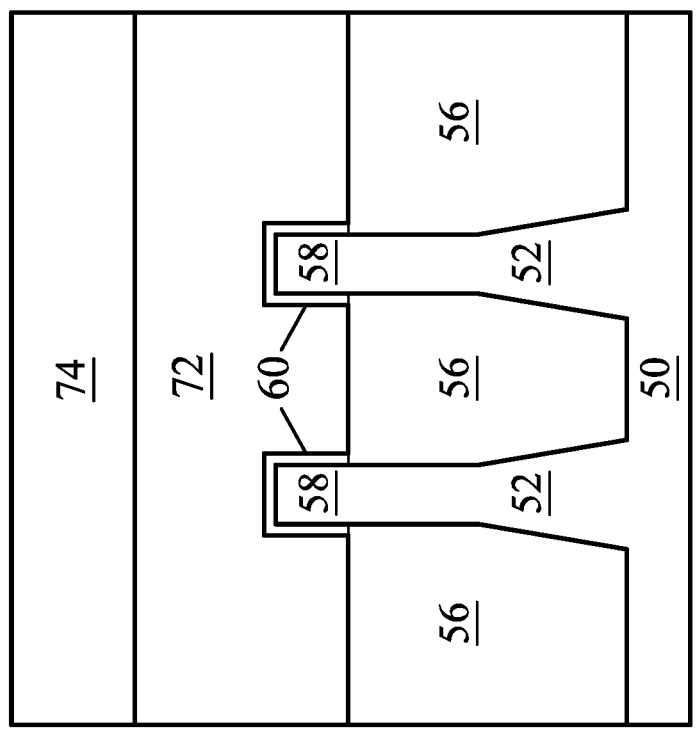

In FIGS. 10A and 10B, recesses 81 are etched in the fins 52. The etch process can be isotropic or anisotropic, and it may be selective with respect to one or more crystalline planes of the fin material. As a result, the recesses 81, shown in FIG. 10B as having round bottom profiles, can in practice have various profile shapes based on the etch process implemented. The etch process may be a dry etch, such as a RIE, NBE, or the like, or a wet etch, such as one using tetramethylammonium hydroxide (TMAH), ammonium hydroxide (NH$_4$OH), or other etchants. FIG. 10B illustrates the recesses 81 along cross-section B-B as illustrated in FIG. 1.

In FIGS. 11A through 17D, epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. The epitaxial source/drain regions 82 may extend into the fins 52. The gate spacers 86 may be used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, or the like. The epitaxial source/drain regions 82 in the region 50N may have surfaces raised from respective surfaces of the fins 52. In an embodiment, the epitaxial source/drain regions 82 may be epitaxially grown in the region 50N with a process that does not produce facets. In other embodiments, the epitaxial source/drain regions 82 may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, or the like. The epitaxial source/drain regions 82 in the region 50P may also have surfaces raised from respective surfaces of the fins 52. In an embodiment, the epitaxial source/drain regions 82 may be epitaxially grown in the region 50P with a process that does not produce facets. In other embodiments, the epitaxial source/drain regions 82 may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of in a range of about $10^{19}$ cm$^{-3}$ to about $10^{21}$ cm$^{-3}$. The n-type and/or p-type impurities for source/drain regions may be any of the impurities previously discussed. In some embodiments, the epitaxial source/drain regions 82 may be in situ doped during growth.

FIGS. 11A through 17D illustrate the formation in the region 50P of epitaxial source/drain regions 82 which may comprise silicon germanium (Si$_x$Ge$_{1-x}$, where x can be in the range of 0 to 1) doped with boron (B). In some embodiments, each of the epitaxial source/drain regions 82 comprises a first layer 82A, a second layer 82B, a third layer 82C, a fourth layer 82D, and a fifth layer 82E (as illustrated below in FIG. 17B). The first layer 82A may also be called the first body layer 82A, the second layer 82B may also be called the second body layer 82B, the third layer 82C may also be called the third body layer 82C, the fourth layer 82D may also be called the fourth body layer 82D, and the fifth layer 82E may also be called the fifth body layer 82E. In other embodiments, the epitaxial source/drain regions 82 may have a fewer or greater number of layers. In alternate embodiments for NMOS devices, epitaxial source/drain regions 82, which may comprise silicon and be doped with arsenic (As) or phosphorous (P), may be formed in the region 50N.

The epitaxial source/drain regions 82 are epitaxially grown using metal-organic CVD (MOCVD), molecular beam epitaxy (MBE), liquid phase epitaxy (LPE), vapor phase epitaxy (VPE), selective epitaxial growth (SEG), a combination thereof, or the like. When the epitaxial source/drain regions 82 are formed of silicon germanium doped by boron, the epitaxial growth process uses a suitable Si precursor, a suitable Ge precursor, and a suitable B precursor. The B precursor provides boron source for in situ doping the epitaxial source/drain regions 82 during the epitaxial growth process. The suitable Si precursor may be silane (SiH$_4$), dichlorosilane (DCS), disilane (Si$_2$H$_6$), Si$_3$H$_8$, a combination thereof, or the like. In some embodiments, the suitable Ge precursor may be germanium tetrahydride (GeH$_4$), digermane (Ge$_2$H$_6$), combination thereof, or the like. In other embodiments, the suitable B precursor may be diborane (B$_2$H$_6$), or the like.

Figure 11B:
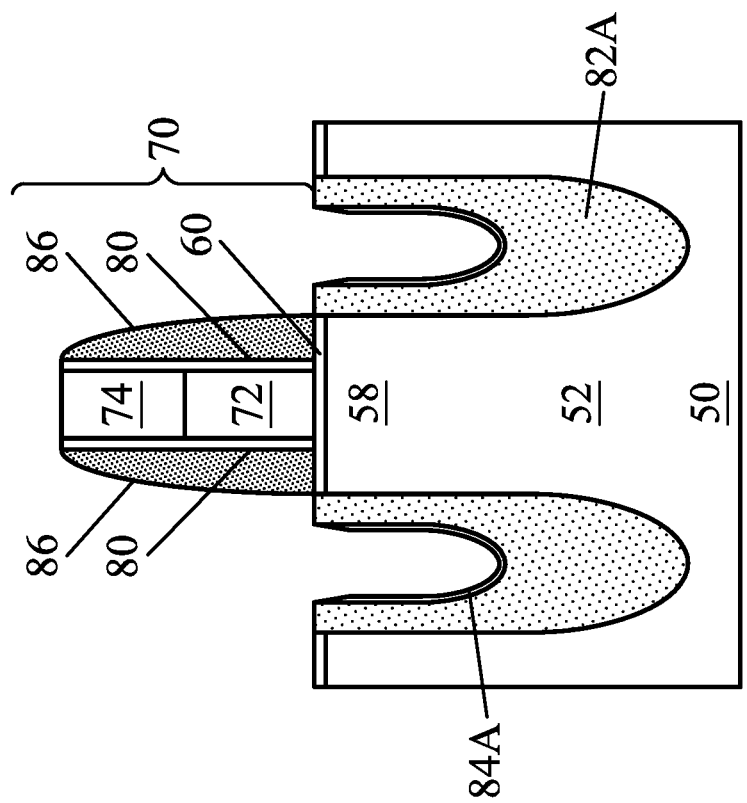
Figure 11A:
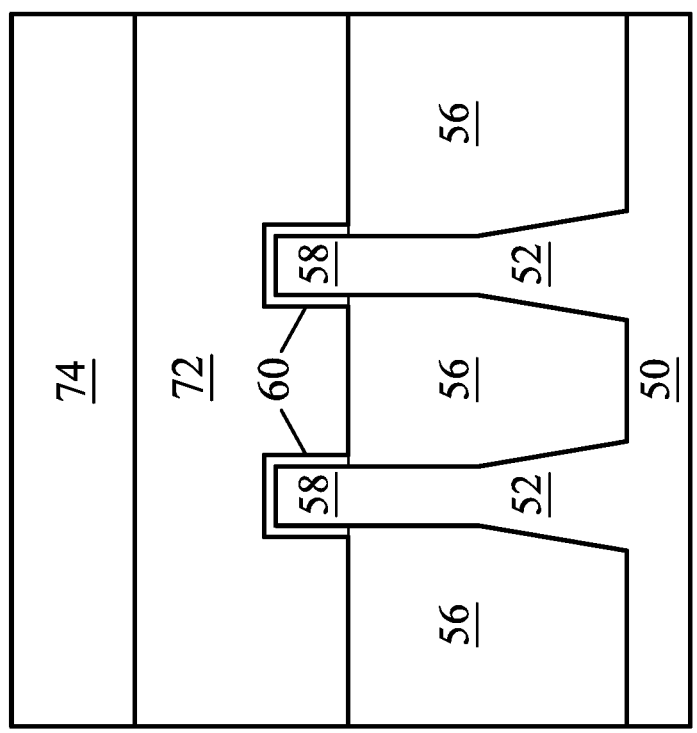
Figure 11C:
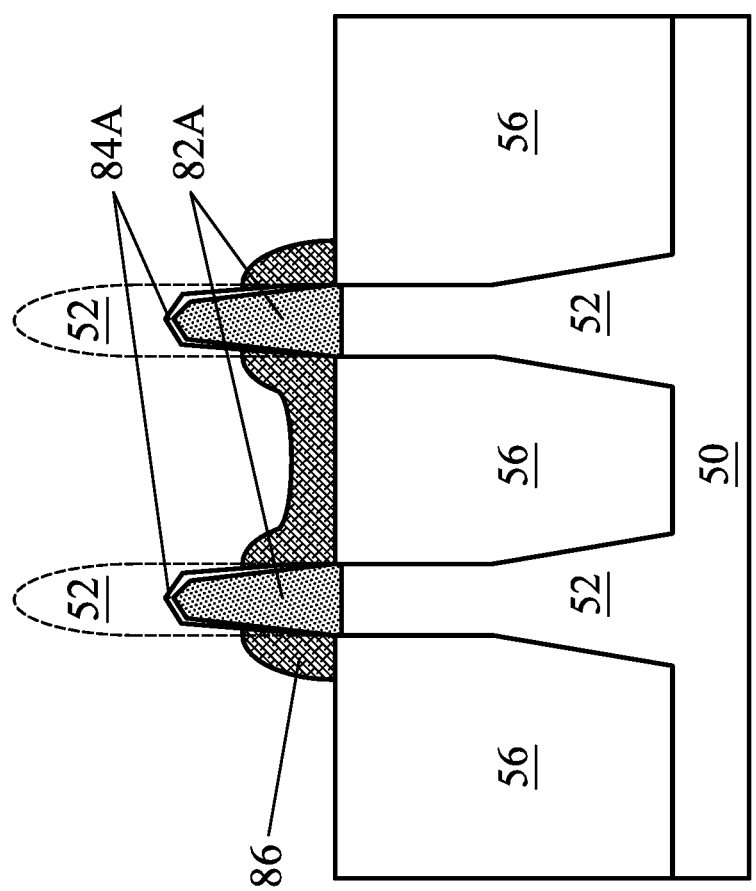

FIGS. 11B and 11C illustrates the formation of the first layer 82A using an exemplary process. The dashed lines around fins 52 show the maximum height of fins 52 in cross-section A-A, for purpose of comparison with the height of the epitaxial source/drain regions in cross-section C-C as illustrated in FIG. 11C. In the exemplary process, the first layer 82A has a Ge concentration in a range of about 10% atomic percent (at %) to 40% at %. In some embodiments, the first layer 82A has a B concentration in a range of about $5\times10^{19}$ atoms/cm$^3$ to $2\times10^{21}$ atoms/cm$^3$. A flow rate of the Si precursor may be in a range of about 5 sccm to about 500 sccm and a flow rate of the Ge precursor may be in a range of about 10 sccm to about 800 sccm. A flow rate of the B precursor may be in a range of about 10 sccm to about 800 sccm. The epitaxial growth process may be performed at a temperature in a range of about 350° C. to 850° C. and the epitaxial growth process may be performed at a pressure in a range of about 5 Torr to 450 Torr.

FIGS. 11B and 11C further illustrate the formation of a first buffer layer 84A on the first layer 82A. The first buffer layer 84A may comprise silicon germanium ($Si_{1-x}Ge_x$, where x may be in the range of 0 to 0.1) doped with boron (B). In accordance with some embodiments, buffer layers are disposed in the source/drain region 82 to improve the epitaxial growth of source/drain structures. The first buffer layer 84A may have a Ge concentration in a range of about 0 at % to about 15 at %. The first buffer layer 84A may have a B concentration in a range of about 0 atoms/cm$^3$ to about $5\times10^{20}$ atoms/cm$^3$. A flow rate of the Si precursor may be in a range of about 5 sccm to about 500 sccm. In some embodiments, a flow rate of the Ge precursor may be in a range of about 10 sccm to about 800 sccm, and a flow rate of the B precursor may be in a range of about 10 sccm to about 800 sccm. The epitaxial growth process may be performed at a temperature in a range of about 350° C. to 800° C., and the epitaxial growth process may be performed at a pressure in a range of about 5 Torr to 450 Torr. The thickness of the first buffer layer 84A may be in a range of about 2 Å to about 30 Å.

Figure 12B:
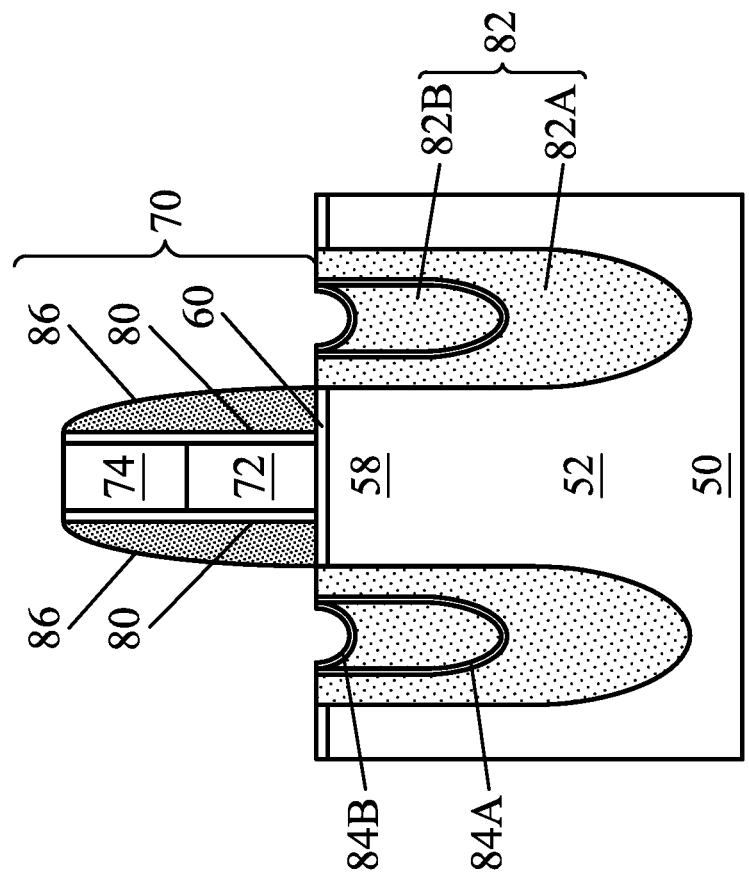
Figure 12A:
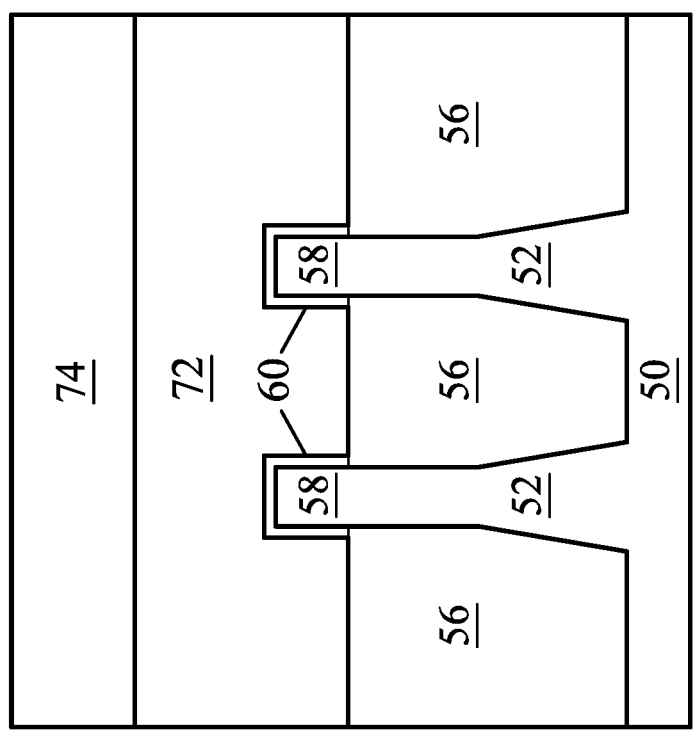
Figure 12C:
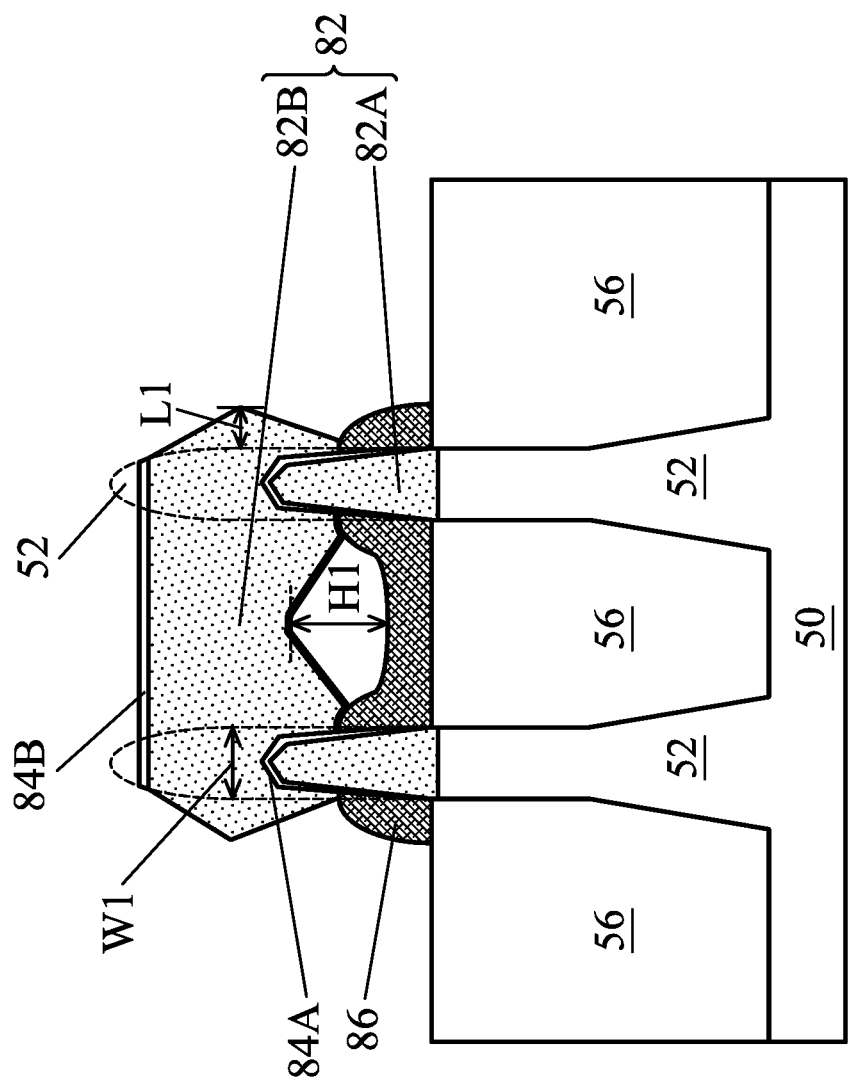
Figure 12D:
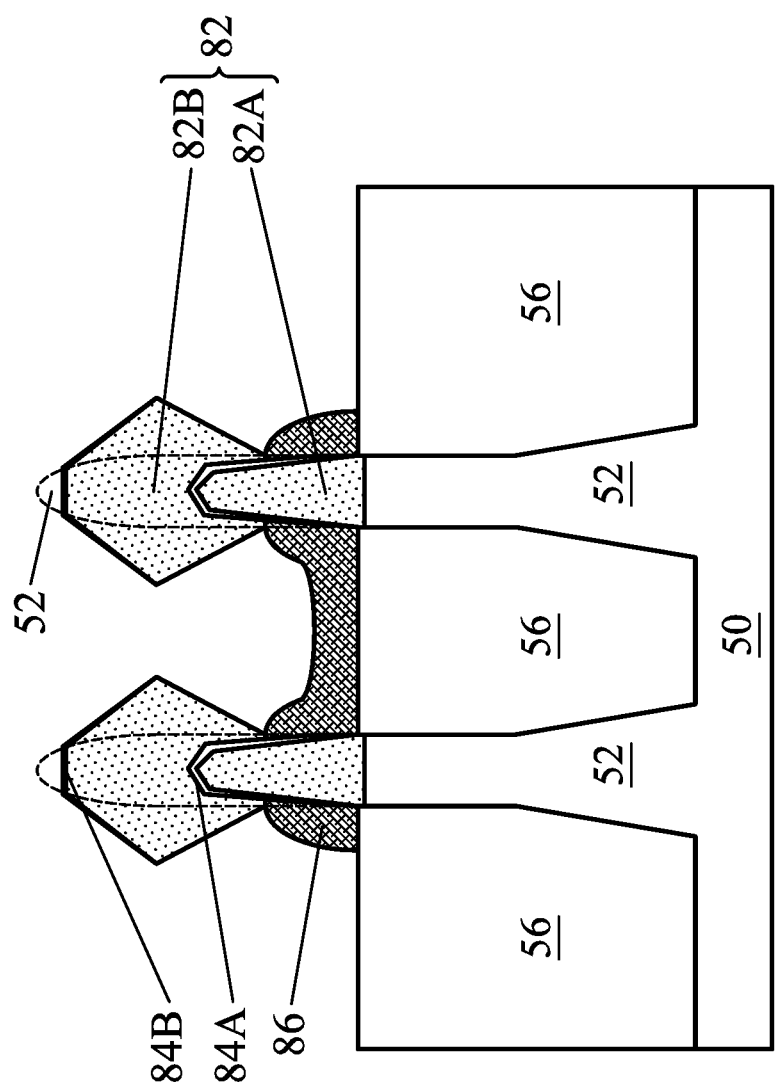

FIGS. 12B, 12C, and 12D illustrate the formation of the second layer 82B. FIG. 12C illustrates embodiments including those for the fabrication of logic circuits in which the source/drain regions on adjacent fins are allowed to merge. FIG. 12D illustrates embodiments including those for the fabrication of SRAM devices in which the source/drain regions on adjacent fins are separated. The merging of the source/drain regions on adjacent fins may be restricted by an etching process selective to denser regions of the source/drain regions. The etching process may be a dry etch using an etchant comprising HF, HCl, HBr, a fluorine gas such as CF$_4$, CH$_2$F$_2$, CH$_3$F$_3$, CHF$_3$, C$_4$F$_8$, C$_4$F$_6$, NF$_3$, or SF$_6$, some carbon polymer gas, for example CH$_4$, CO, CO$_2$, or COS, the like, or a combination thereof. The dry etch may be performed under suitable pressure, such as e.g. in a range of about 2 mTorr to about 100 mTorr, and at suitable temperature, such as e.g. about 30° C. to about 80° C.

The second layer 82B may have a Ge concentration in a range of about 30 at % to about 70 at %, and the second layer 82B may have a B concentration in a range of about $1\times10^{20}$ atoms/cm$^3$ to $2\times10^{21}$ atoms/cm$^3$. A flow rate of the Si precursor may be in a range of about 5 sccm to about 500 sccm, and a flow rate of the Ge precursor may be in a range of about 10 sccm to about 800 sccm. A flow rate of the B precursor may be in a range of about 10 sccm to about 800 sccm. The epitaxial growth process may be performed at a temperature in a range of about 350° C. to 800° C., and the epitaxial growth process may be performed at a pressure in a range of about 5 Torr to 450 Torr. The epitaxial growth process may be performed so that the second layer 82B does not have facets. Restraining the growth of facets may be performed with an etching process selective to denser regions of the source/drain regions. The etching process may be a dry etch using an etchant comprising HF, HCl, HBr, a fluorine gas such as CF$_4$, CH$_2$F$_2$, CH$_3$F$_3$, CHF$_3$, C$_4$F$_8$, C$_4$F$_6$, NF$_3$, or SF$_6$, some carbon polymer gas, for example CH$_4$, CO, CO$_2$, or COS, the like, or a combination thereof. The dry etch may be performed under suitable pressure, such as e.g. in a range of about 2 mTorr to about 100 mTorr, and at suitable temperature, such as e.g. about 30° C. to about 80° C.

In embodiments in which the source/drain regions on adjacent fins are allowed to merge, as illustrated in FIG. 12C, a lateral distance L1 between the fin 52 and an outer vertex of the second layer 82B, may be less than about 10 nm. A ratio of a width W1 of fin 52 to the lateral distance L1 may be in a range of about 3:10 to 3:3. Additionally, there may be an air gap between the second layer 82B and the gate spacers 86 as illustrated in FIG. 12C. The air gap may have a height H1 in a range of about 5 nm to about 30 nm.

FIGS. 12B, 12C, and 12D further illustrate the formation of a second buffer layer 84B on the second layer 82B. The second buffer layer 84B may comprise silicon germanium ($Si_{1-x}Ge_x$, where x may be in the range of 0 to 0.15) doped with boron (B). In accordance with some embodiments, buffer layers are disposed in the source/drain region 82 to improve the epitaxial growth of source/drain structures. The second buffer layer 84B may have a Ge concentration in a range of about 0 at % to about 15 at %. The second buffer layer 84B may have a B concentration in a range of about 0 atoms/cm$^3$ to $5\times10^{20}$ atoms/cm$^3$. A flow rate of the Si precursor may be in a range of about 5 sccm to about 500 sccm. In some embodiments, a flow rate of the Ge precursor may be in a range of about 10 sccm to about 800 sccm, and a flow rate of the B precursor may be in a range of about 10 sccm to about 800 sccm. The epitaxial growth process may be performed at a temperature in a range of about 350° C. to 800° C., and the epitaxial growth process may be performed at a pressure in a range of about 5 Torr to 450 Torr. The thickness of the second buffer layer 84B may be in a range of 2 Å to 30 Å.

Figure 13B:
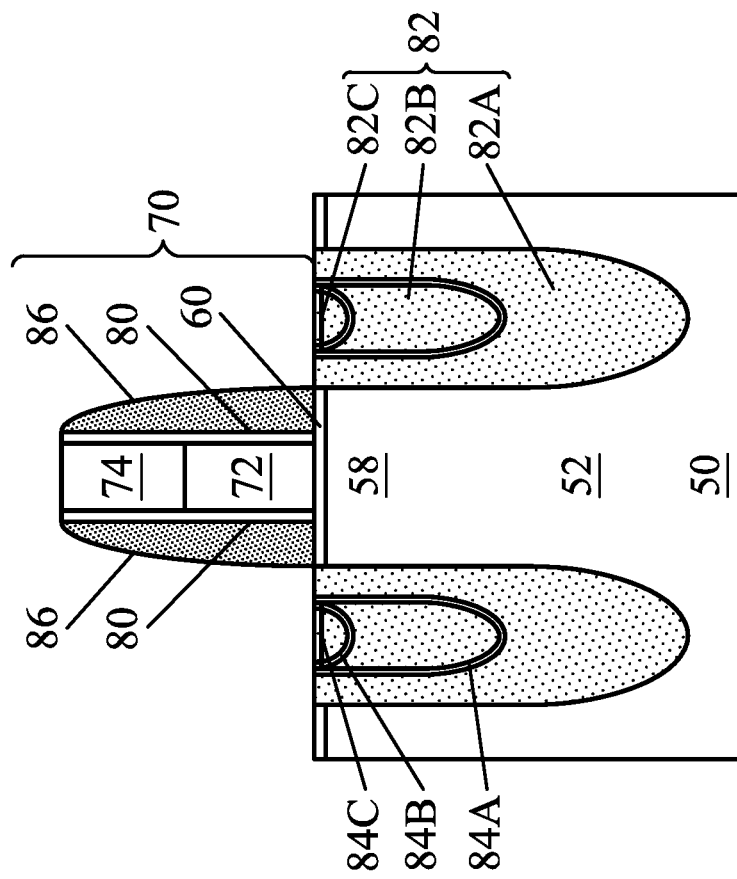
Figure 13A:
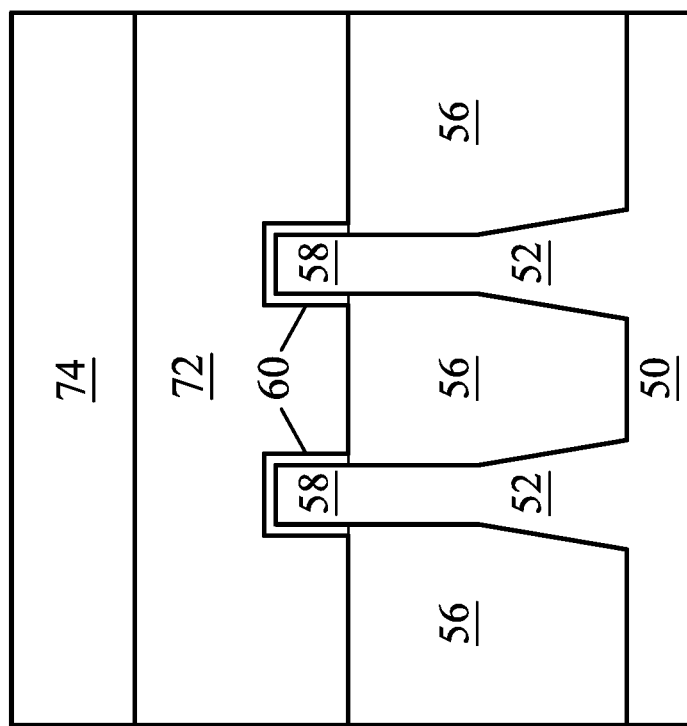
Figure 13C:
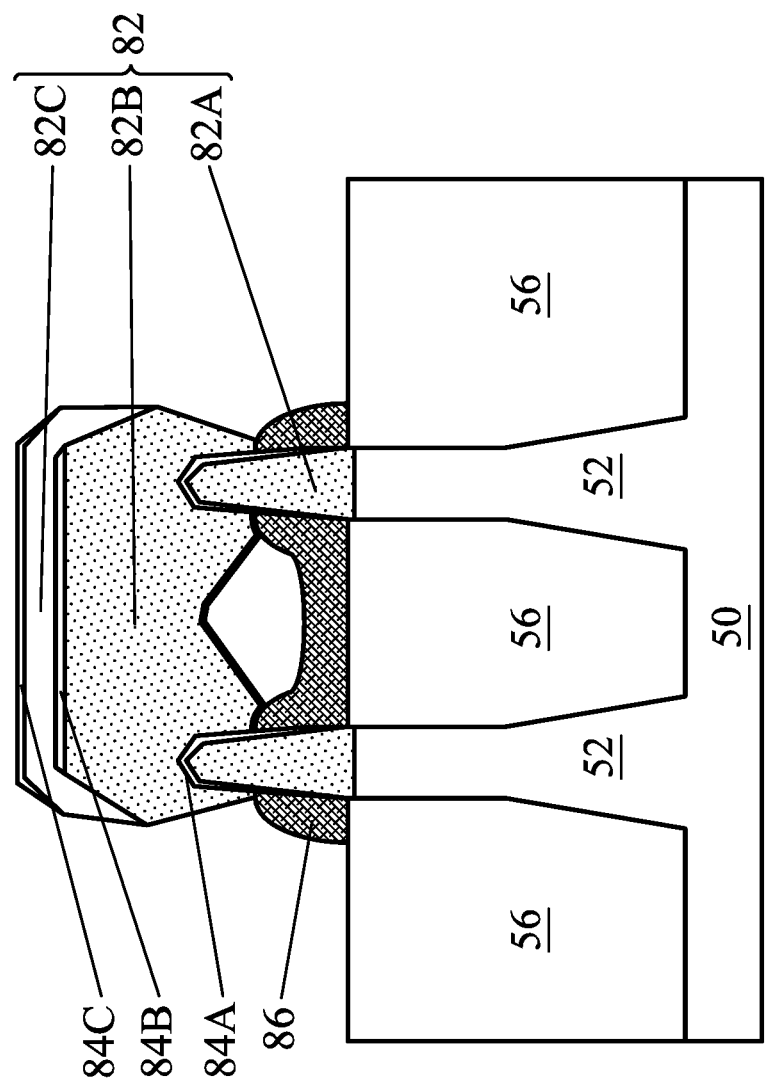

FIGS. 13C through 16D illustrate embodiments in which two cycles of a deposition and etch back, or dep-etch, of additional epitaxially grown layers of the source/drain region 82 are carried out. In alternate embodiments, more than two cycles of the dep-etch may be performed. FIGS. 13C and 13D illustrate the formation of the third layer 82C. FIG. 13C illustrates embodiments including those for the fabrication of logic circuits in which the source/drain regions on adjacent fins are allowed to merge. FIG. 13D illustrates embodiments including those for the fabrication of SRAM devices in which the source/drain regions on adjacent fins are prohibited from merging. The third layer 82C may have a Ge concentration in a range of about 30 at % to about 70 at %, and the third layer 82C may have a B concentration in a range of about $2\times10^{20}$ atoms/cm$^3$ to $2\times10^{21}$ atoms/cm$^3$. A flow rate of the Si precursor may be in a range of about 5 sccm to about 500 sccm, and a flow rate of the Ge precursor may be in a range of about 10 sccm to about 800 sccm. A flow rate of the B precursor may be in a range of about 10 sccm to about 800 sccm. The epitaxial growth process may be performed at a temperature in a range of about 350° C. to about 800° C., and the epitaxial growth process may be performed at a pressure in a range of about 5 Torr to about 450 Torr.

Figure 13D:
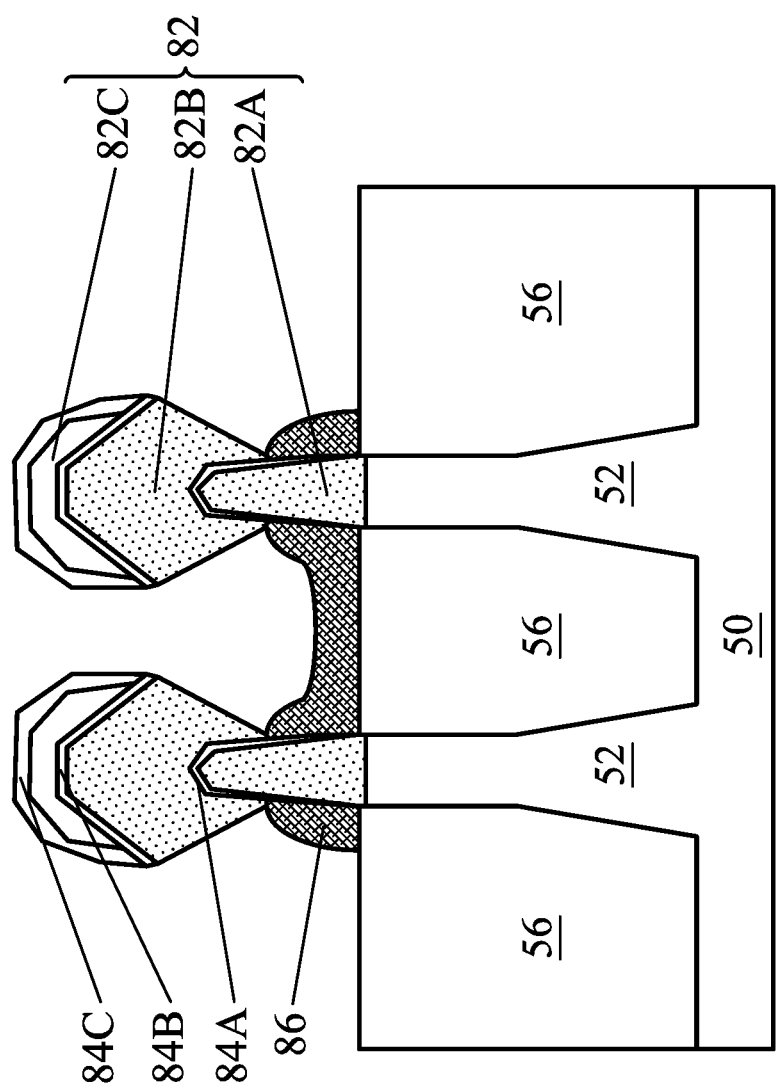

FIGS. 13C and 13D further illustrate the formation of a third buffer layer 84C on the third layer 82C. The third buffer layer 84C may comprise silicon germanium ($Si_{1-x}Ge_x$, where x may be in the range of 0 to 0.15) doped with boron (B). In accordance with some embodiments, buffer layers are disposed in the source/drain region 82 to improve the epitaxial growth of source/drain structures. The third buffer layer 84C may have a Ge concentration in a range of about 0 at % to about 15 at %. The third buffer layer 84C may have a B concentration in a range of about 0 atoms/cm$^3$ to 5×10$^{20}$ atoms/cm$^3$. A flow rate of the Si precursor may be in a range of about 5 sccm to about 500 sccm. In some embodiments, a flow rate of the Ge precursor may be in a range of about 10 sccm to about 800 sccm, and a flow rate of the B precursor may be in a range of about 10 sccm to about 800 sccm. The epitaxial growth process may be performed at a temperature in a range of about 350° C. to about 800° C., and the epitaxial growth process may be performed at a pressure in a range of about 5 Torr to about 450 Torr. The thickness of the third buffer layer 84C may be in a range of about 2 Å to about 30 Å.

Figure 14B:
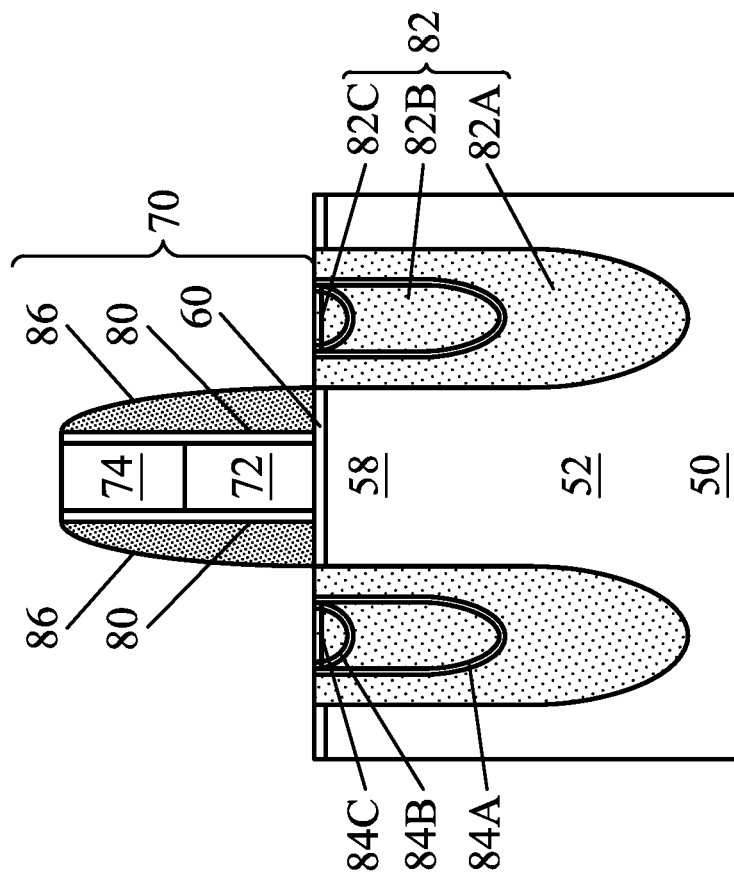
Figure 14A:
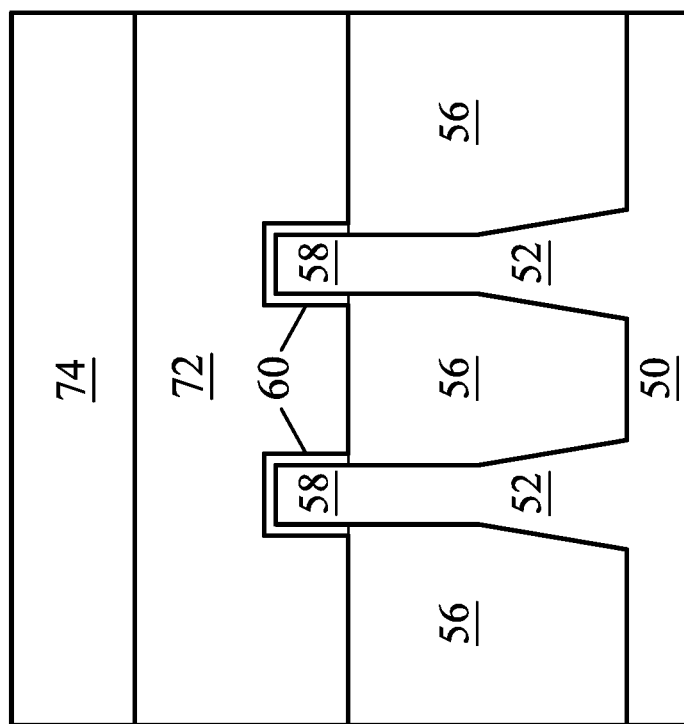
Figure 14C:
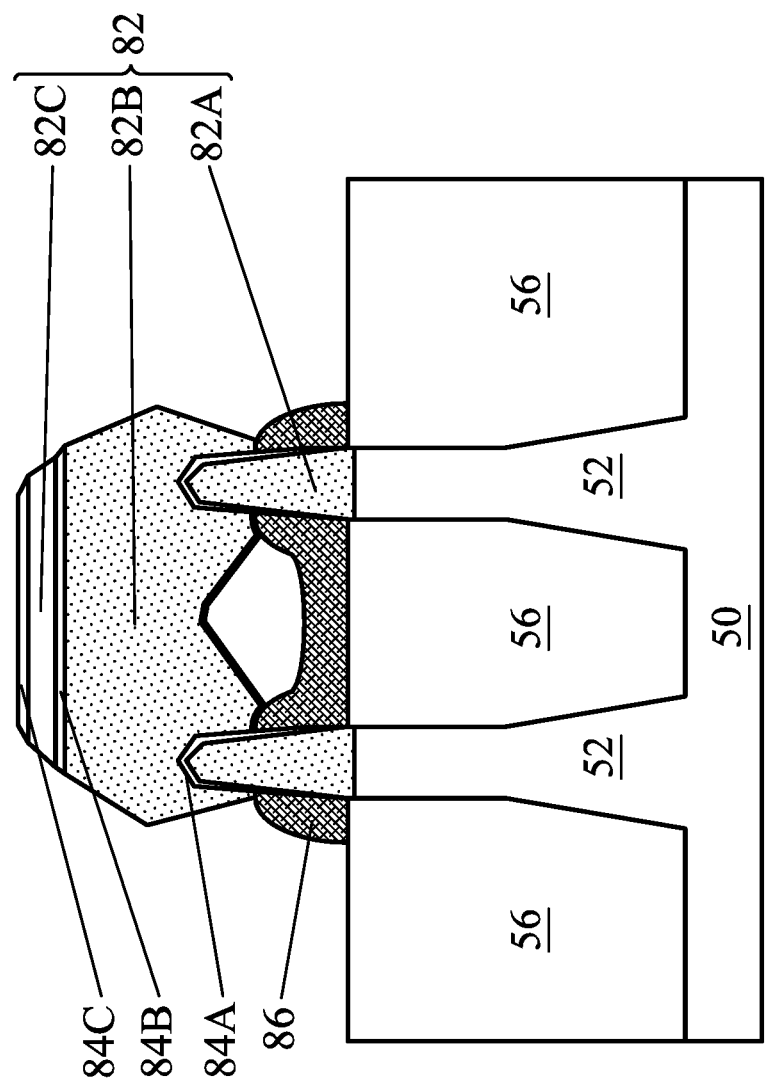
Figure 14D:
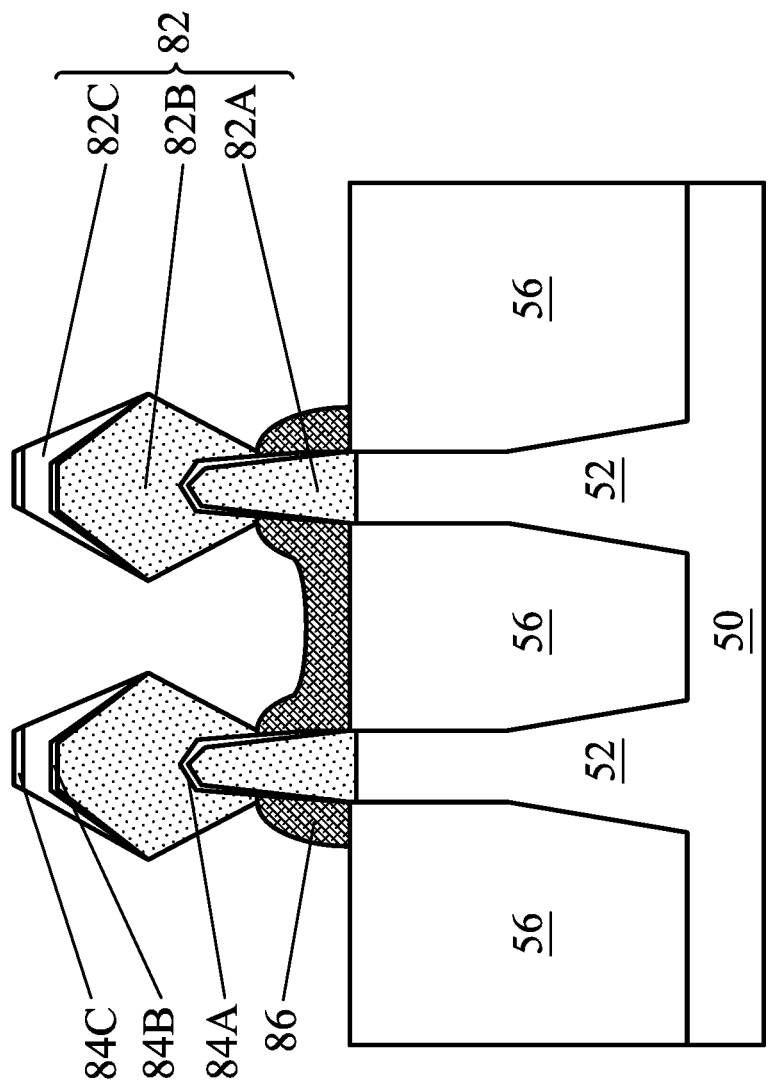

FIGS. 14C and 14D illustrate a first etching back of the third layer 82C and the third buffer layer 84C. FIG. 14C illustrates embodiments including those for the fabrication of logic circuits in which the source/drain regions on adjacent fins are allowed to merge. FIG. 14D illustrates embodiments including those for the fabrication of SRAM devices in which the source/drain regions on adjacent fins are prohibited from merging. The first etch back process may be a dry etch performed with a gas comprising HCl, HF, HBr, H$_2$, Ge, the like, or a combination thereof. In some embodiments, the dry etch is performed with a mixed gas comprising HCl, Ge, and H$_2$. The first etch back may be performed at a temperature in a range of about 400° C. to about 700° C., for a period in a range of 20 seconds to 600 seconds. The first etch back may use N$_2$ or H$_2$ as carrier gases. After the first etch back, a purge may be carried out with H$_2$ gas for a period in a range of about 10 seconds to about 60 seconds. As shown in FIGS. 14C and 14D, the first etch back removes portions of the third layer 82C and the third buffer layer 84C on their respective sidewalls, reducing the horizontal width of the third layer 82C and the third buffer layer 84C. FIG. 14D illustrates how, in some embodiments such as for SRAM devices, this reduction in horizontal width aids in preventing the merging of adjacent source/drain regions 82.

Figure 15B:
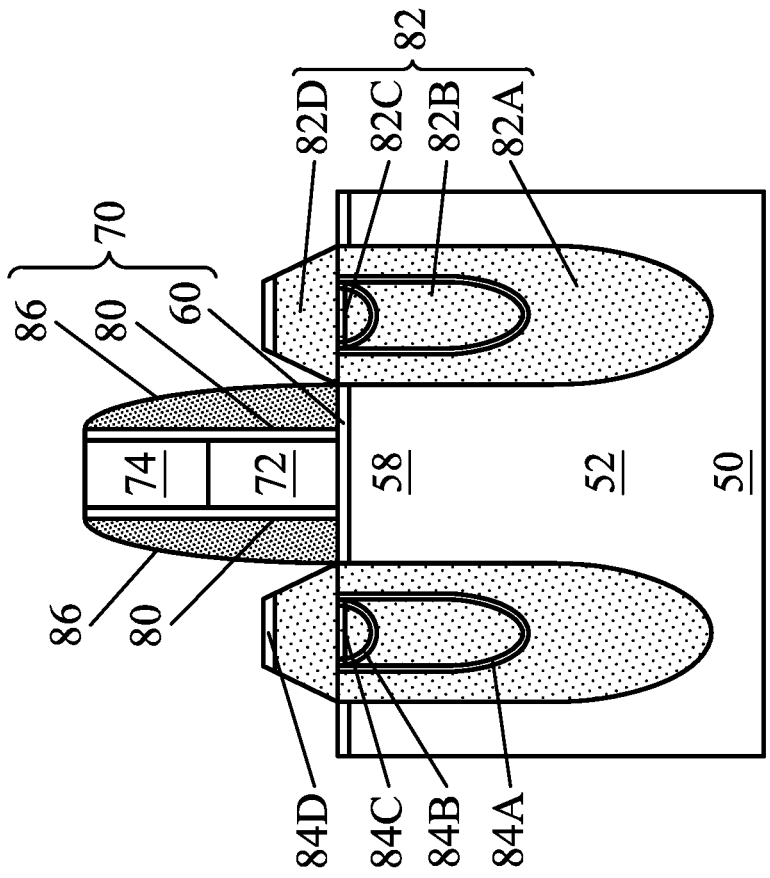
Figure 15A:
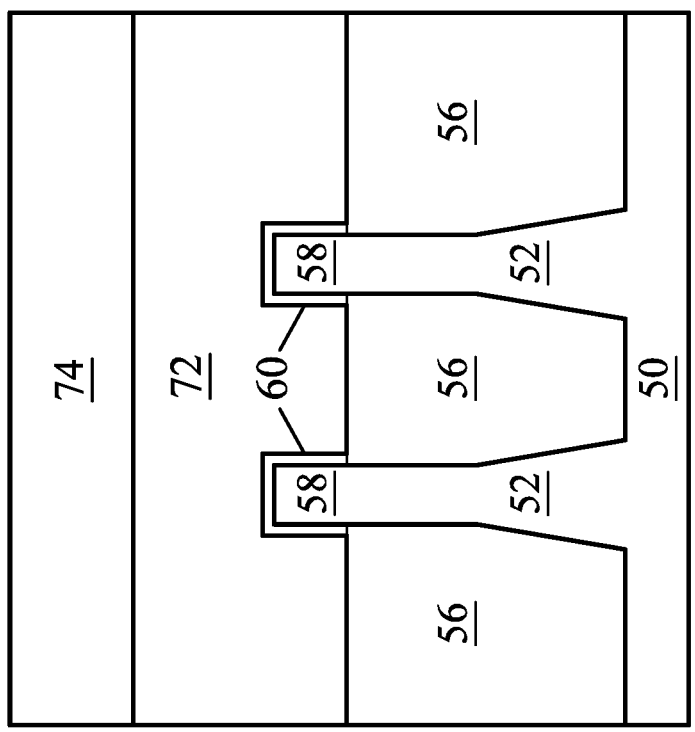
Figure 15C:
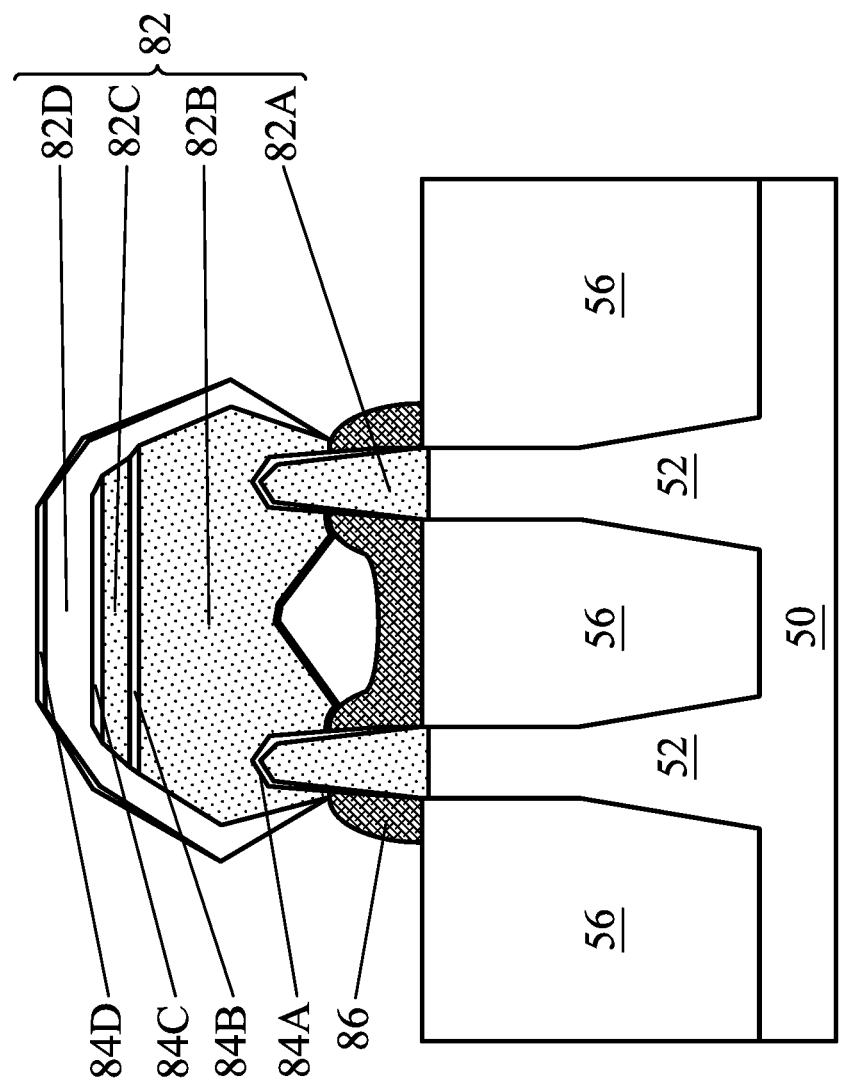
Figure 15D:
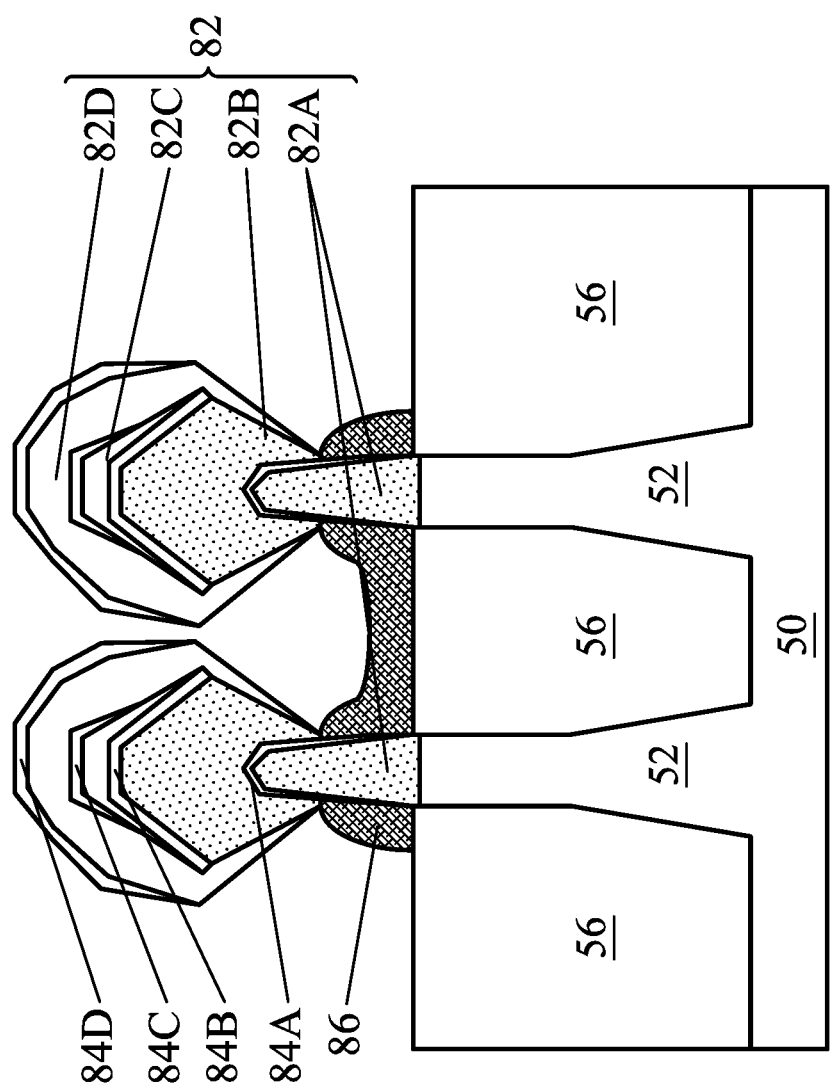

FIGS. 15C and 15D illustrate the formation of the fourth layer 82D. FIG. 15C illustrates embodiments including those for the fabrication of logic circuits in which the source/drain regions on adjacent fins are allowed to merge. FIG. 15D illustrates embodiments including those for the fabrication of SRAM devices in which the source/drain regions on adjacent fins are prohibited from merging. The fourth layer 82D may have a Ge concentration in a range of about 30 at % to about 70 at %, and the fourth layer 82D may have a B concentration in a range of about 2×10$^{20}$ atoms/cm$^3$ to about 2×10$^{21}$ atoms/cm$^3$. A flow rate of the Si precursor may be in a range of about 5 sccm to about 500 sccm and a flow rate of the Ge precursor may be in a range of about 10 sccm to about 800 sccm. A flow rate of the B precursor may be in a range of about 10 sccm to about 800 sccm. The epitaxial growth process may be performed at a temperature in a range of about 350° C. to about 800° C., and the epitaxial growth process may be performed at a pressure in a range of about 5 Torr to about 450 Torr.

FIGS. 15C and 15D further illustrate the formation of a fourth buffer layer 84D on the fourth layer 82D. The fourth buffer layer 84D may comprise silicon germanium (Si$_{1-x}$Ge$_x$, where x can be in the range of 0 to 0.15) doped with boron (B). The fourth buffer layer 84D may have a Ge concentration in a range of about 0 at % to about 15 at %, and the fourth buffer layer 84D may have a B concentration in a range of about 0 atoms/cm$^3$ to about 5×10$^{20}$ atoms/cm$^3$. A flow rate of the Si precursor may be in a range of about 5 sccm to about 500 sccm. A flow rate of the Ge precursor may be in a range of about 10 sccm to about 800 sccm. A flow rate of the B precursor is in a range of about 10 sccm to about 800 sccm. The epitaxial growth process may be performed at a temperature in a range of about 350° C. to about 800° C., and the epitaxial growth process may be performed at a pressure in a range of about 5 Torr to about 450 Torr. The thickness of the fourth buffer layer 84D may be in a range of about 2 Å to about 30 Å.

Figure 16B:
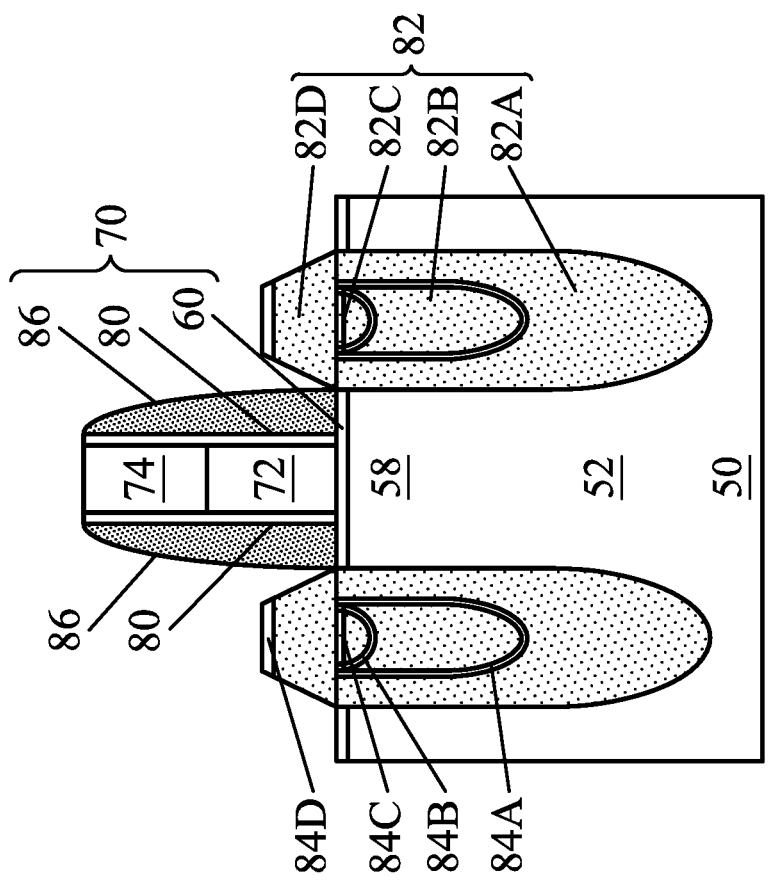
Figure 16A:
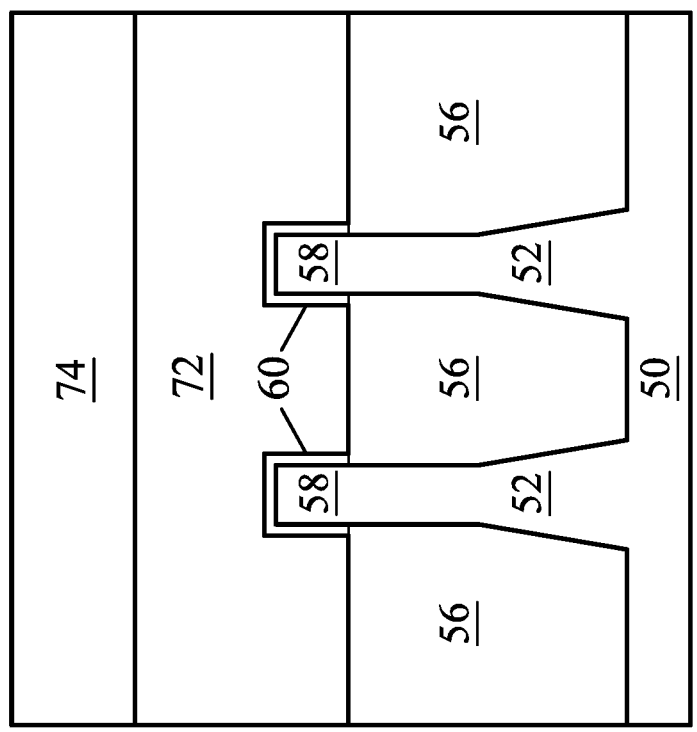
Figure 16C:
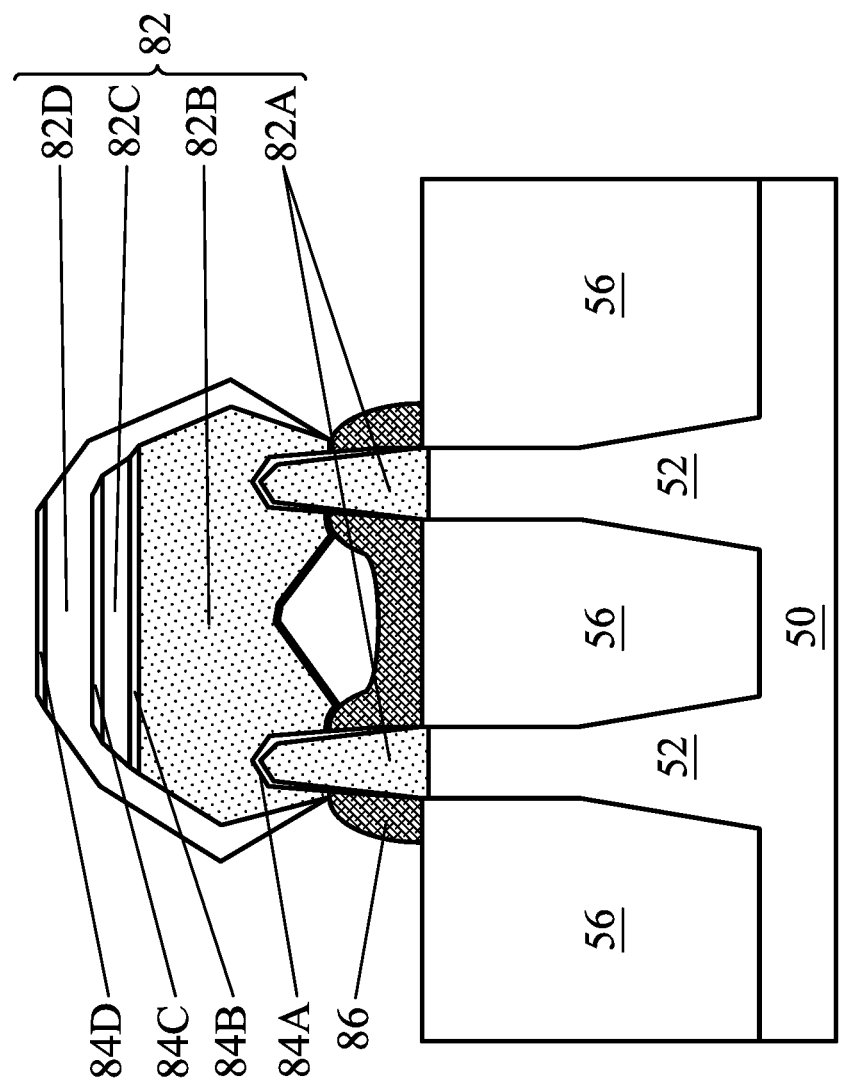
Figure 16D:
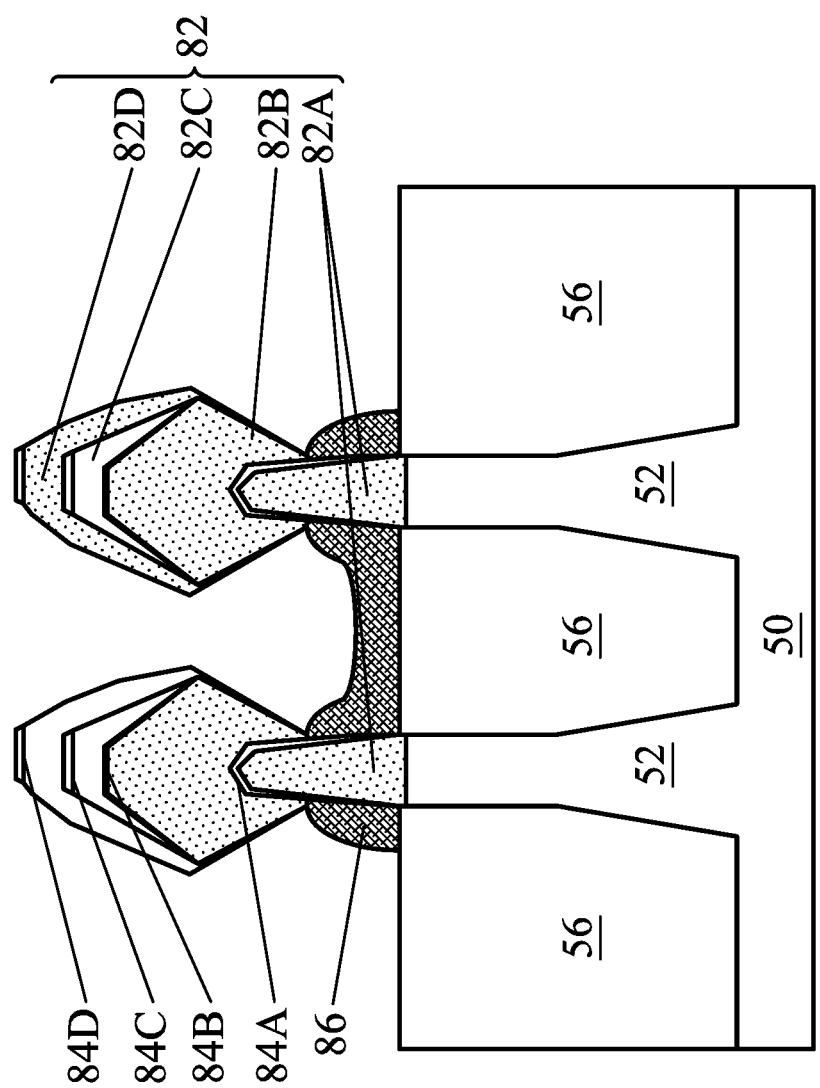

FIGS. 16C and 16D illustrate a second etching back of the fourth layer 82D and the fourth buffer layer 84D. FIG. 16C illustrates embodiments including those for the fabrication of logic circuits in which the source/drain regions on adjacent fins are allowed to merge. FIG. 16D illustrates embodiments including those for the fabrication of SRAM devices in which the source/drain regions on adjacent fins are prohibited from merging. The second etch back process may be a dry etch performed with HCl, HF, HBr, H$_2$, Ge, the like, or a combination thereof. In some embodiments, the dry etch is performed with a mixed gas comprising HCl, Ge, and H$_2$. The second etch back may be performed at a temperature in a range of about 400° C. to about 700° C. for a period in a range of 20 seconds to 600 seconds. The second etch back may use N$_2$ or H$_2$ as carrier gases. After the second etch back, a purge may be carried out with H$_2$ gas for a period in a range of 10 seconds to 60 seconds. As shown in FIGS. 16C and 16D, the second etch back removes portions of the fourth layer 82D and the fourth buffer layer 84D on their respective sidewalls, reducing the horizontal width of the fourth layer 82D and the fourth buffer layer 84D.

Figure 17B:
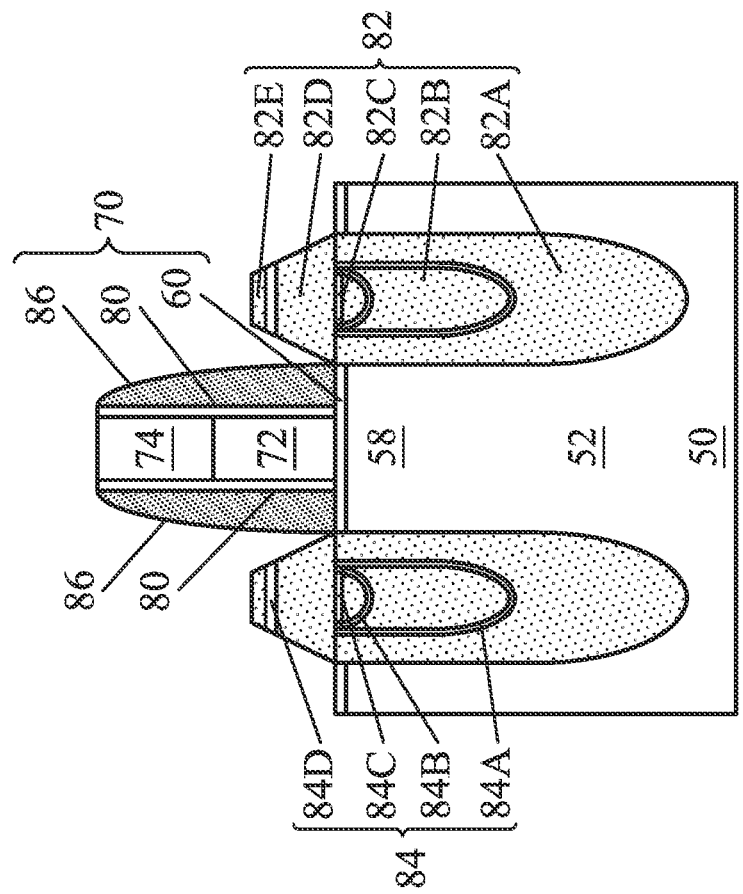
Figure 17A:
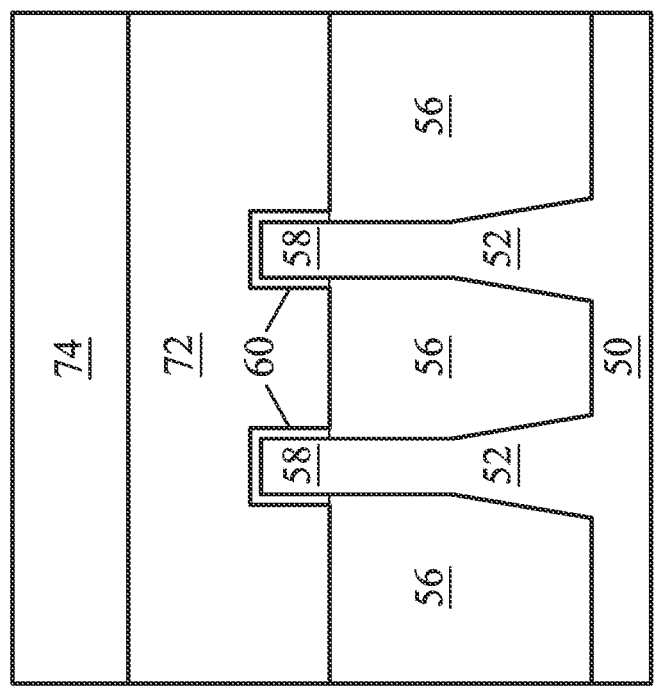
Figure 17C:
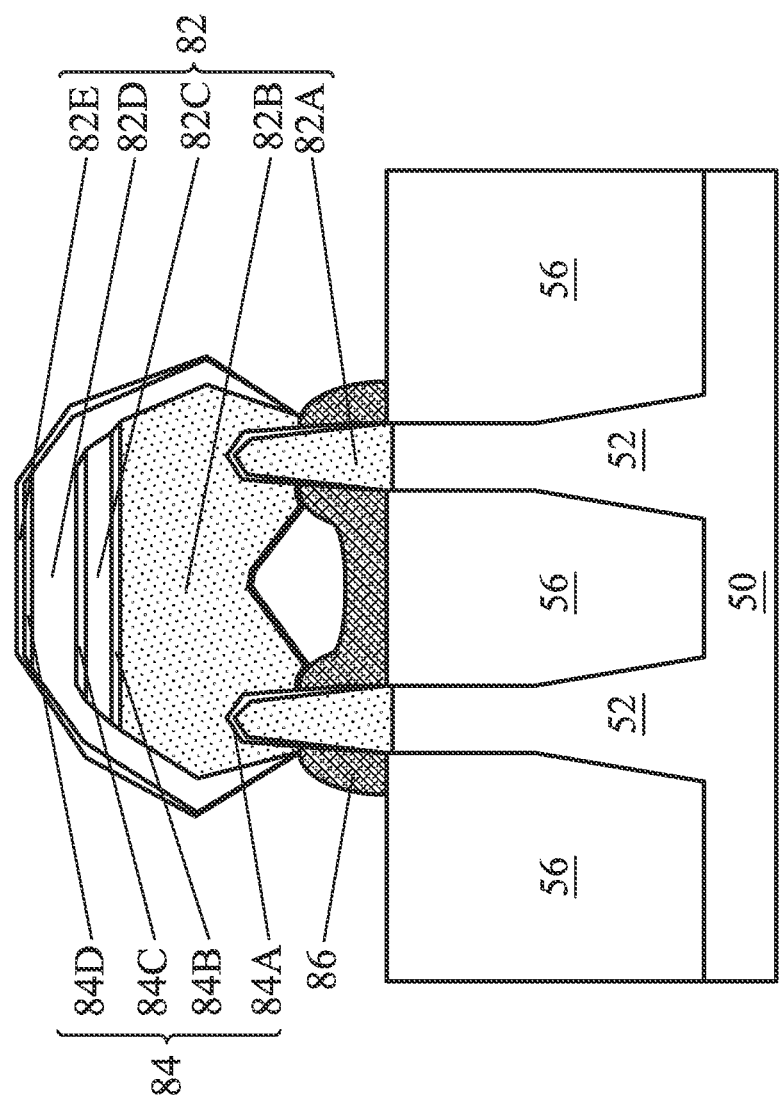
Figure 17D:
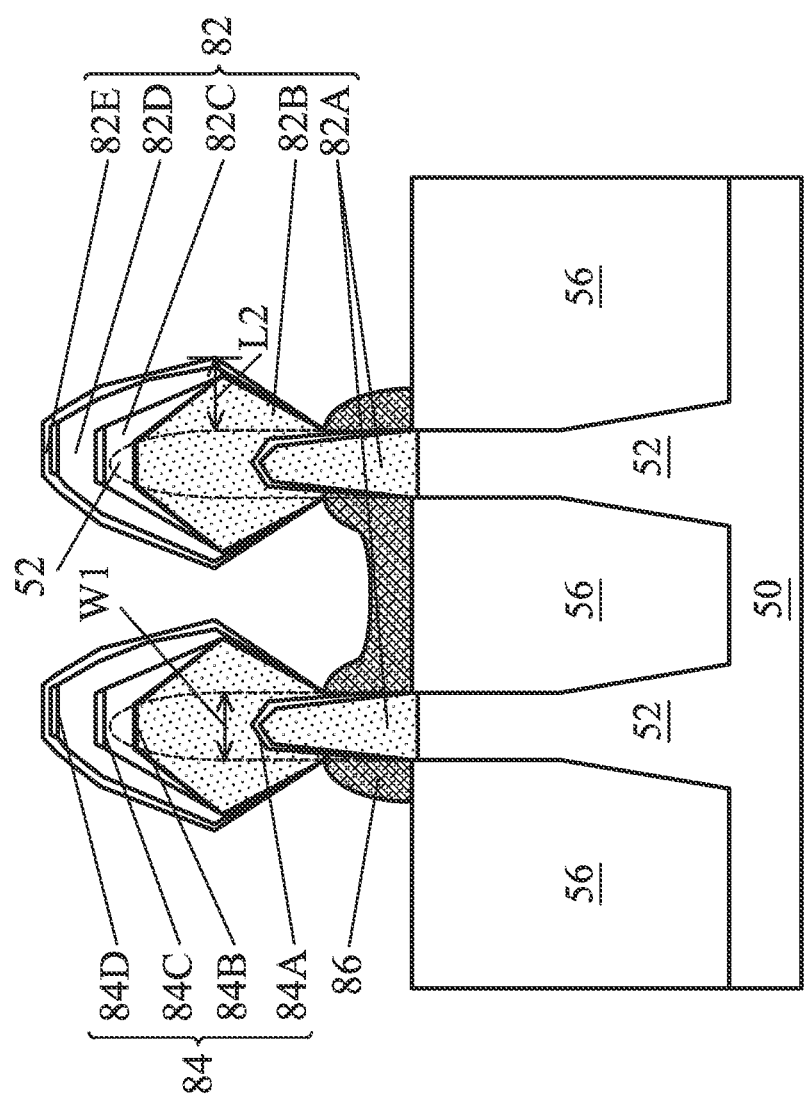

FIGS. 17B through 17D illustrate the formation of the fifth layer 82E and the completion of source/drain regions 82. FIG. 17B illustrates the completed source/drain regions 82 along cross-section B-B as illustrated in FIG. 1. FIG. 17C illustrates embodiments, including those for the fabrication of logic circuits in which the source/drain regions on adjacent fins are allowed to merge, along cross-section C-C as illustrated in FIG. 1. FIG. 17D illustrates embodiments, including those for the fabrication of SRAM devices in which the source/drain regions on adjacent fins are prohibited from merging, along cross-section C-C as illustrated in FIG. 1.

In some embodiments, as illustrated in FIGS. 17B through 17D, the fifth layer 82E is formed on the fourth layer 82D and the fourth buffer layer 84D. The fifth layer 82E may also be referred to as a cap layer or a protection layer. The fifth layer may comprise silicon germanium (Si$_{1-x}$Ge$_x$, where x can be in the range of 0 to 0.3) doped with boron (B). The fifth layer 82E may be deposited or may be epitaxially grown using metal-organic CVD (MOCVD), molecular beam epitaxy (MBE), liquid phase epitaxy (LPE), vapor phase epitaxy (VPE), selective epitaxial growth (SEG), a combination thereof, or the like. A thickness of the fifth layer 82E may be less than about 6 nm. A total thickness of the deposited layers 82 and the buffer layers 84 may be in a range of about 40 nm to about 80 nm. In an embodiment, the total thickness of deposited the layers 82 and the buffer layers 84 is about 12 nm. In embodiments in which the source/drain regions on adjacent fins are prohibited from merging, as illustrated in FIG. 17D, a lateral distance L2 between a sidewall of the fin 52 and an outer vertex of a sidewall of the source/drain region 82, may be less than about half of the pitch between adjacent fins 52 to prevent merging of the epitaxial source/drain regions 82, such as about 15 nm. A ratio of a width W1 of fin 52 to the lateral distance L2 may be in a range of about 1:1 to 1:2.5.

Figures 18A, 18B:
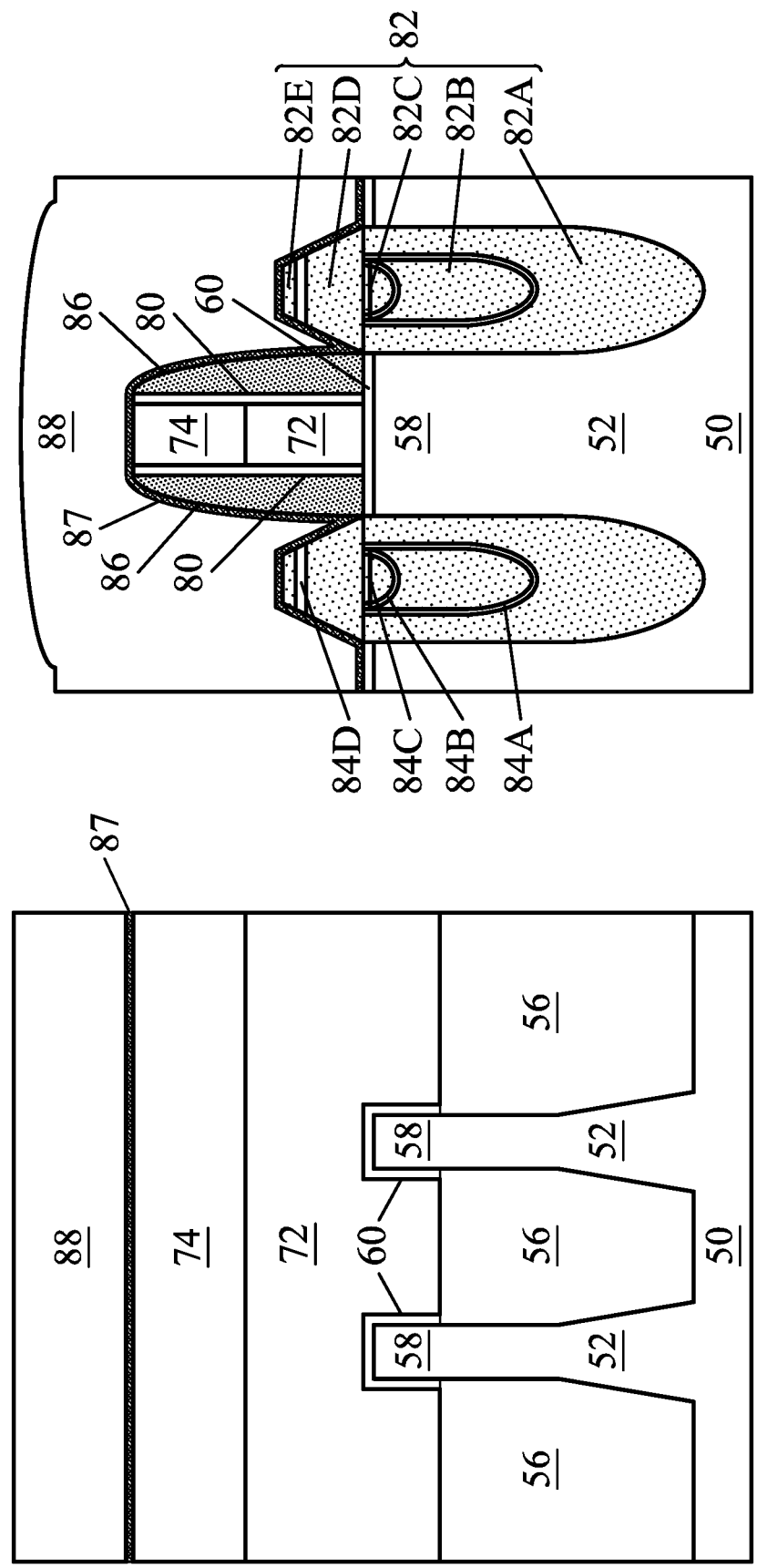

In FIGS. 18A and 16B, a first ILD 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium ($Si_xGe_{1-x}$, where x can be between approximately 0 and 1), pure Germanium, or the like. Other insulation or semiconductor materials formed by any acceptable process may be used. In some embodiments, a contact etch stop layer (CESL) 87 is disposed between the first ILD 88 and the epitaxial source/drain regions 82, the hard mask 74, and the gate spacers 86. The CESL 87 may comprise a dielectric material, such as, silicon nitride, silicon oxide, silicon ox nitride, or the like, having a different etch rate than the material of the overlying first ILD 88.

Figure 19B:
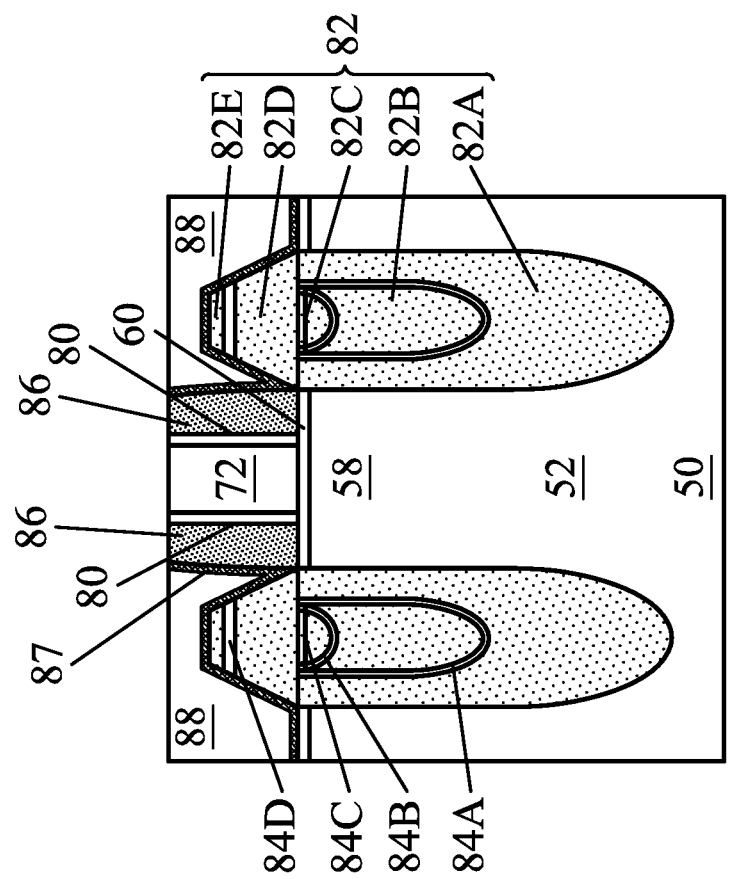
Figure 19A:
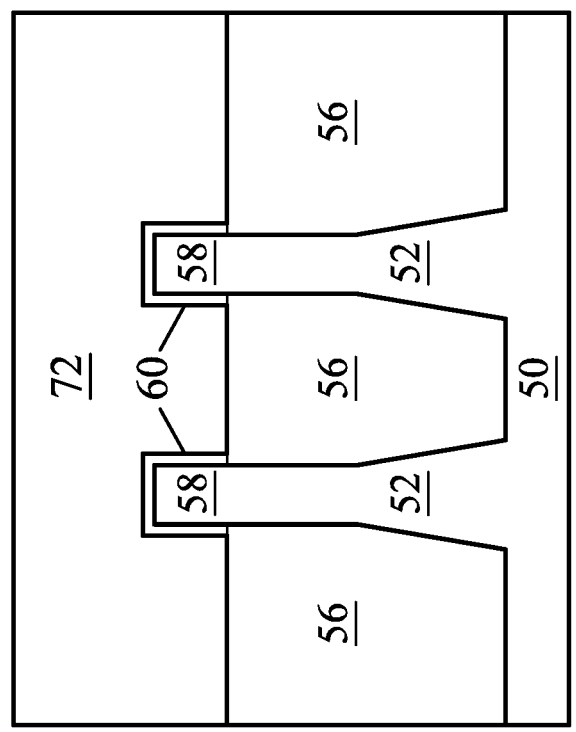

In FIGS. 19A and 19B, a planarization process, such as a CMP, may be performed to level the top surface of the first ILD 88 with the top surfaces of the dummy gates 72. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88.

Figure 20B:
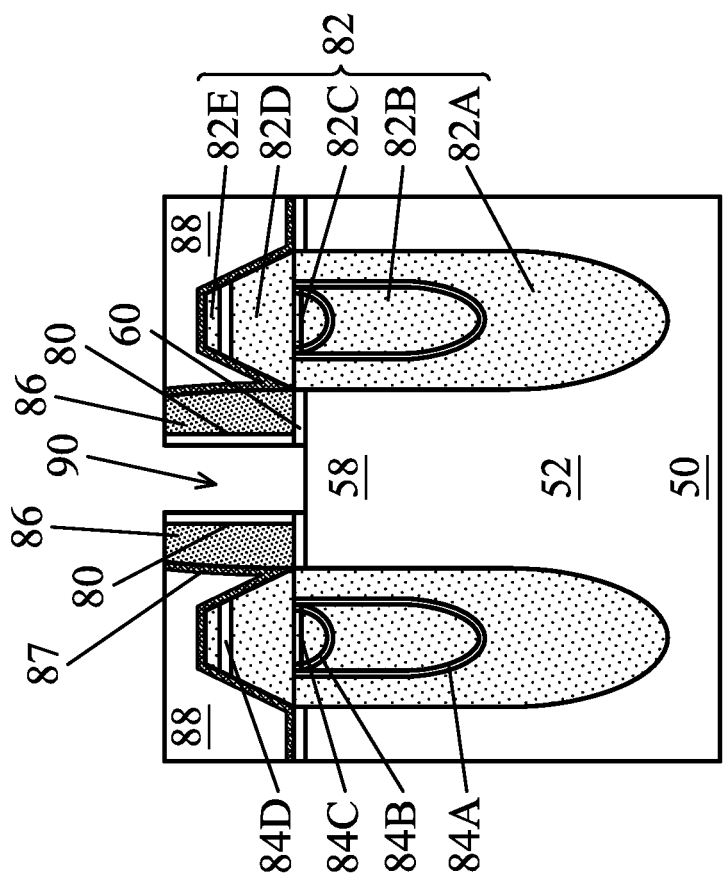
Figure 20A:
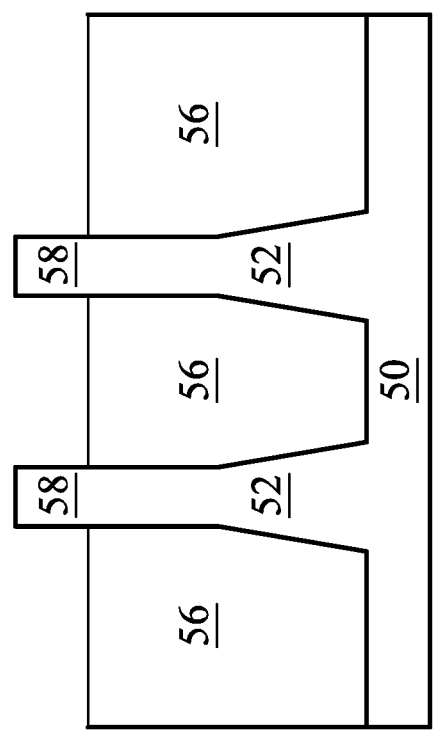

In FIGS. 20A and 20B, the dummy gates 72 are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 21B:
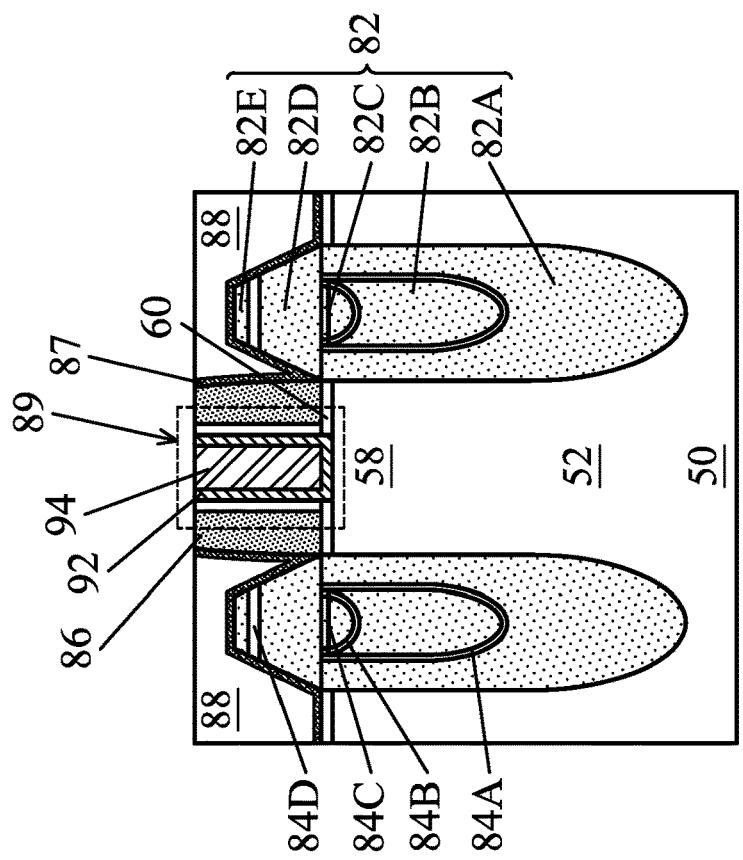
Figure 21A:
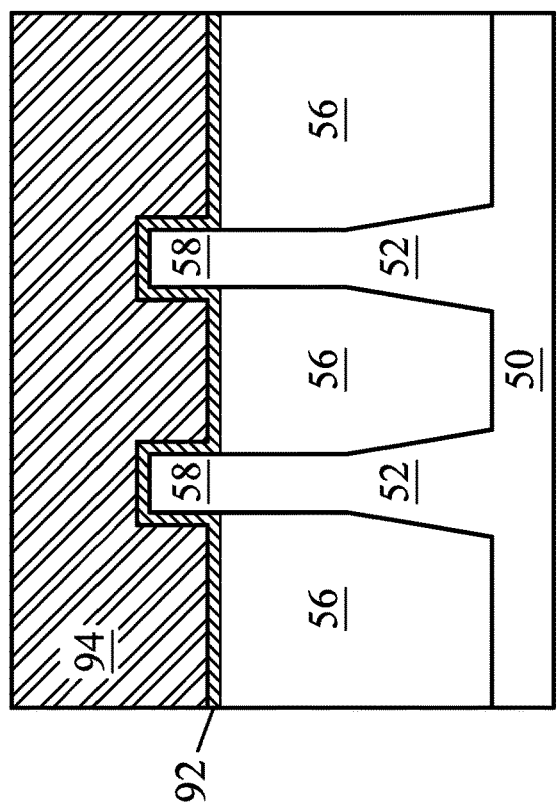
Figure 21C:
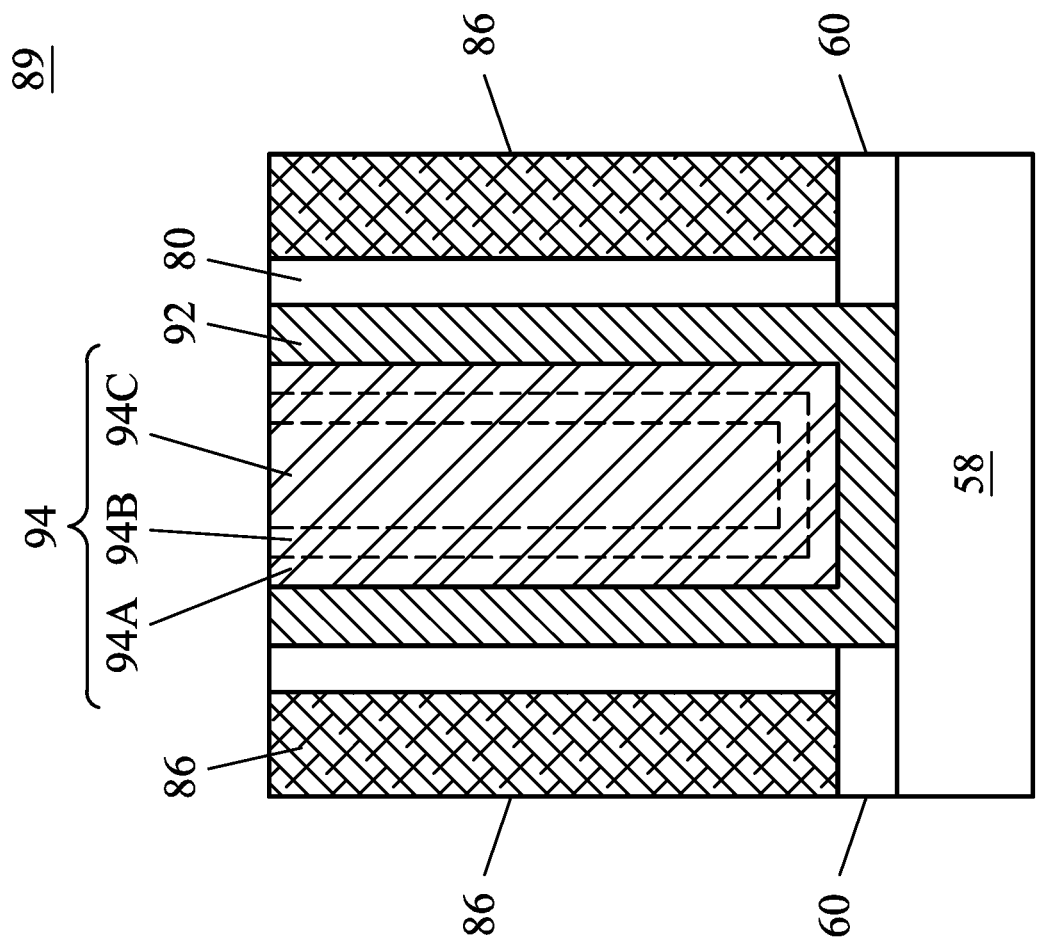

In FIGS. 21A and 21B, gate dielectric layers 92 and gate electrodes 94 are formed for replacement gates. FIG. 21C illustrates a detailed view of region 89 of FIG. 21B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on top surface of the first ILD 88. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., SiO).

The gate electrodes 94 are deposited over the gate dielectric layers 92, respectively, and fill the remaining portions of the recesses 90. The gate electrodes 94 may be a metal-containing material such as TiN, TiO, TaN, TaC, Co, Ru, Al, W, combinations thereof, or multi-layers thereof. For example, although a single layer gate electrode 94 is illustrated in FIG. 21B, the gate electrode 94 may comprise any number of liner layers 94A, any number of work function tuning layers 94B, and a fill material 94C as illustrated by FIG. 21C. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

Figure 22B:
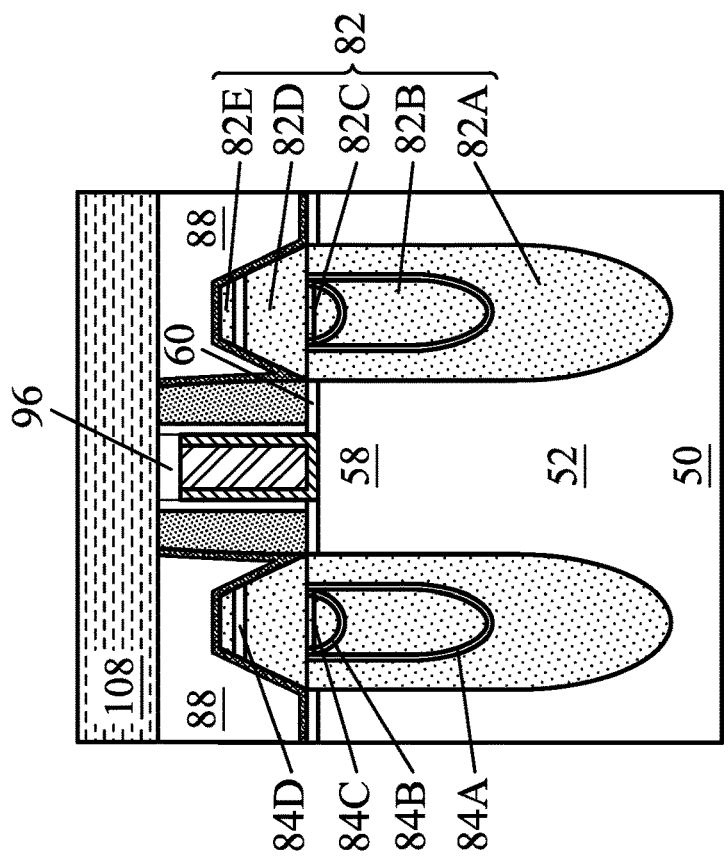
Figure 22A:
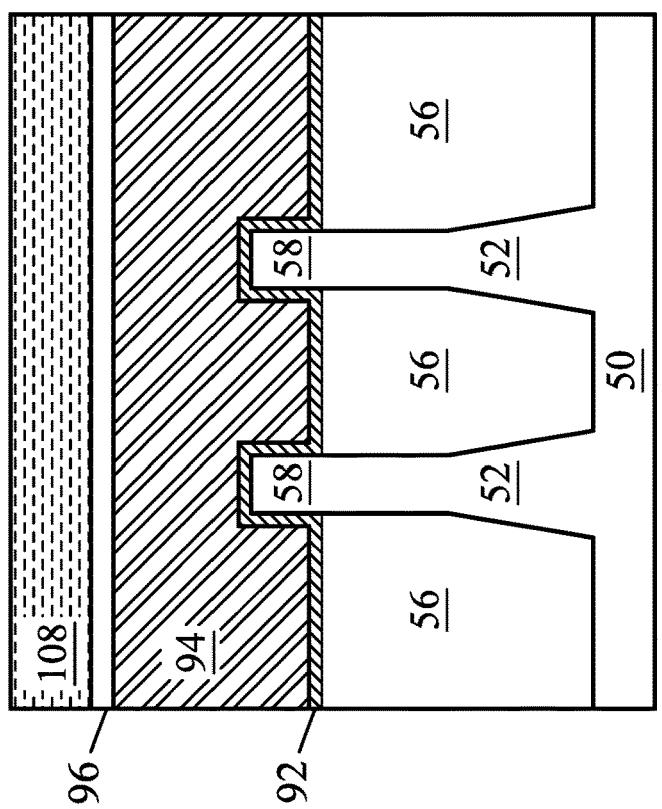
Figure 23B:
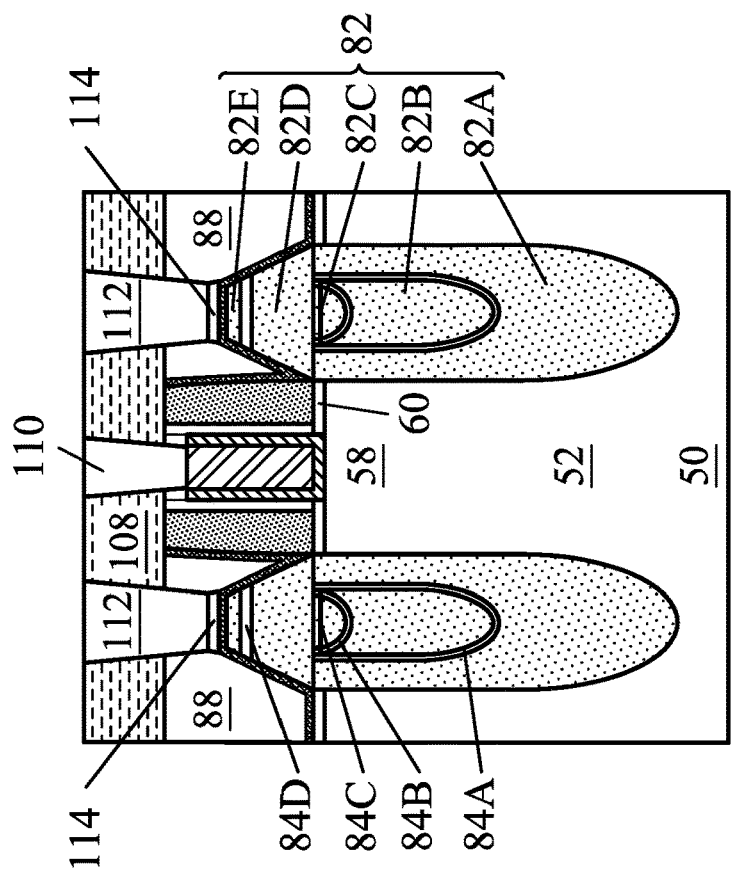
Figure 23A:
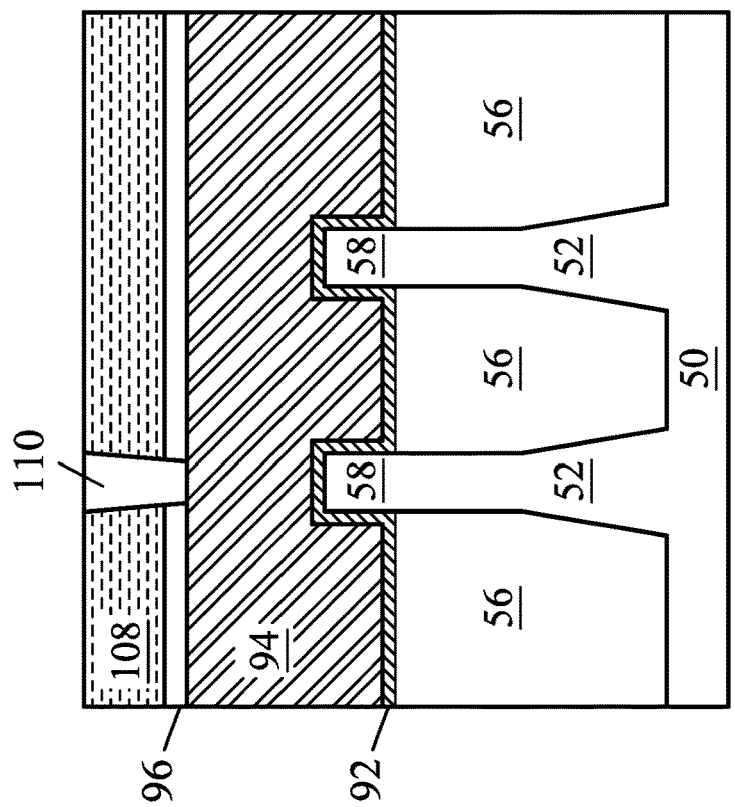

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes. In FIGS. 22A and 22B, a second ILD 108 is deposited over the first ILD 88. In an embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In FIGS. 23A and 23B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

As discussed above, FinFET-based devices including static random access memory (SRAM) and logic devices benefit from increased volume of epitaxially grown source/drain regions. Increased height of source/drain regions above the top surfaces of the semiconductor fins in which the source/drain regions are embedded and increased volume can improve device performance by reducing contact resistance. This is because intermediate fabrication processes can consume significant portions of epitaxially grown source/drain regions, so an increased volume of the source/drain regions from the epitaxial growth stage will allow for a larger final volume of the source/drain regions. The increased volume of the epitaxially grown source/drain regions, together with the lower energy barrier between subsequently formed source/drain contacts and the epitaxially grown source/drain regions (due to the high dopant concentration of the epitaxially grown source/drain regions), advantageously reduces the contact resistance of the formed FinFET device. This can be achieved by a multi-cycle growth using a repeated deposition and etching (dep-etch) to increase the height of the source/drain regions and restrain horizontal growth of the source-drain regions.

In accordance with an embodiment, a semiconductor device includes a first semiconductor fin and a second semiconductor fin, the first semiconductor fin and the second semiconductor fin extending from a substrate, a gate electrode over the first semiconductor fin and the second semiconductor fin, and a source/drain region adjacent to the gate electrode and over the first semiconductor fin and the second semiconductor fin, such that a top surface of the source/drain region is higher than a top surface of the first semiconductor fin and the second semiconductor fin under the gate electrode, such that the source/drain region includes a plurality of buffer layers and a plurality of body layers, such that the source/drain region includes alternating layers of a buffer layer of the plurality of buffer layers and a body layer of the plurality of body layers, and such that each of the plurality of buffer layers has an average thickness in a range of about 2 Å to about 30 Å. In an embodiment, the top surface of the source/drain region is higher than the top surface of the first semiconductor fin and the second semiconductor fin by at least 6 nm. In an embodiment, the plurality of buffer layers includes silicon germanium doped with boron. In an embodiment, the plurality of buffer layers includes a Ge concentration in a range of about 0 atomic percent to about 15 atomic percent. In an embodiment, the source/drain region includes germanium in a range of about 10 atomic percent to about 70 atomic percent. In an embodiment, the gate electrode and the source/drain region are components of a transistor in a logic circuit. In an embodiment, an air gap is interposed between the source/drain region and the substrate. In an embodiment, the air gap has a height in a range of 5 nm to 30 nm.

In accordance with another embodiment, a semiconductor device includes a first semiconductor fin and a second semiconductor fin extending from a substrate, and a first source/drain region on the first semiconductor fin and a second source/drain region on the second semiconductor fin, such that the first source/drain region is separated from the second source/drain region, such that top surfaces of the first source/drain region and the second source/drain region are higher than top surfaces of the first semiconductor fin and the second semiconductor fin, and such that the first source/drain region and the second source/drain region each include: a first buffer layer, a first body layer over the first buffer layer, a second buffer layer over the first body layer, and a second body layer over the second buffer layer, such that each of the first buffer layer and the second buffer layer has an average thickness in a range of about 2 Å to about 30 Å. In an embodiment, the first source/drain region and the second source/drain region include germanium in a range of about 10 atomic percent to about 70 atomic percent. In an embodiment, the first source/drain region and the second source/drain region are components of an SRAM device. In an embodiment, a ratio between a width of the first semiconductor fin and a lateral distance between a sidewall of the first semiconductor fin and an outer vertex of a sidewall of the first source/drain region is in a range of about 1:1 to about 1:2.5.

In accordance with yet another embodiment, a method of manufacturing a device includes forming a first semiconductor fin and a second semiconductor fin protruding from a substrate, forming a first gate structure over the first semiconductor fin, recessing the first semiconductor fin to form a first recess adjacent the first gate structure, and forming a first source/drain region in the first recess. Forming the first source/drain region includes epitaxially growing a first body layer in the first recess, epitaxially growing a second body layer on the first body layer, and forming one or more combined layers, such that forming each combined layer includes epitaxially growing an upper body layer, depositing a buffer layer on the upper body layer, and recessing sidewalls of the upper body layer and the buffer layer. In an embodiment, a top surface of an uppermost upper body layer is higher than a top surface of a first semiconductor fin by about 6 nm. In an embodiment, recessing the sidewalls of the upper body layer includes a dry etch using at least one of HCl, HF, or HBr. In an embodiment, the method further includes depositing a protection layer on an uppermost upper body layer. In an embodiment, the method further includes forming a second gate structure over the second semiconductor fin and recessing the second semiconductor fin to form a second recess adjacent the second gate structure, such that forming the first source/drain region simultaneously forms a second source/drain region, and such that the first source/drain region and second source/drain region remain separated. In an embodiment, forming one or more combined layers includes forming more than two combined layers. In an embodiment, the one or more combined layers have a total thickness of about 12 nm. In an embodiment, recessing the sidewalls of the upper body layer includes a dry etch using a mixed gas including HCl, Ge, and $H_2$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a device, the method comprising:
forming a first semiconductor fin and a second semiconductor fin protruding from a substrate;
forming a first gate structure over the first semiconductor fin;
recessing the first semiconductor fin to form a first recess adjacent the first gate structure; and
forming a first source/drain region in the first recess, wherein forming the first source/drain region comprises:
epitaxially growing a first body layer in the first recess;
depositing a first buffer layer on the first body layer;
epitaxially growing a second body layer on the first buffer layer;
depositing a second buffer layer on the second body layer;
epitaxially growing a third body layer on the second buffer layer, the third body layer being recessed below a top surface of the first semiconductor fin;
depositing a third buffer layer on the third body layer; and
recessing sidewalls of the third body layer and the third buffer layer.

2. The method of claim 1, further comprising epitaxially growing one or more upper body layers on the third buffer layer, wherein a top surface of an uppermost upper body layer is higher than a top surface of a first semiconductor fin by 6 nm.

3. The method of claim 2, further comprising depositing a protection layer on an uppermost upper body layer.

4. The method of claim 1, wherein recessing the sidewalls of the third body layer comprises a dry etch using at least one of HCl, HF, or HBr.

5. The method of claim 1, further comprising:
forming a second gate structure over the second semiconductor fin; and
recessing the second semiconductor fin to form a second recess adjacent the second gate structure, wherein forming the first source/drain region simultaneously forms a second source/drain region, wherein the first source/drain region and second source/drain region remain separated.

6. The method of claim 1, wherein recessing the sidewalls of the third body layer comprises a dry etch using a mixed gas comprising HCl, Ge, and $H_2$.

7. A method of manufacturing a device, the method comprising:
forming a first fin and a second fin, the first fin and the second fin extending from a semiconductor substrate;
forming a dummy gate structure over the first fin and the second fin;
etching a first recess in the first fin and etching a second recess in the second fin, the first recess being adjacent to the dummy gate structure, the second recess being adjacent to the second fin;
forming a source/drain region extending from the first recess and the second recess, wherein forming the source/drain region comprises:
forming a first body layer in the first recess and the second recess;
forming a first buffer layer on the first body layer, the first buffer layer having a first germanium concentration;
forming a second body layer on the first buffer layer, the second body layer having a second germanium concentration, the second germanium concentration being greater than the first germanium concentration; and
forming alternating additional buffer layers and additional body layers, wherein each additional buffer layer has an average thickness in a range of 2 Å to 30 Å, wherein each additional buffer layer has a respective germanium concentration smaller than the second germanium concentration, wherein each additional body layer has a respective germanium concentration greater than each respective germanium concentration of each additional buffer layer; and
replacing the dummy gate structure with a gate electrode, wherein a top surface of the first fin under the gate electrode is lower than a top surface of the source/drain region.

8. The method of claim 7, wherein the top surface of the first fin under the gate electrode is lower than a top surface of the source/drain region by greater than or equal to 6 nm.

9. The method of claim 7, wherein the first buffer layer and the additional buffer layers comprise silicon germanium doped with boron.

10. The method of claim 9, wherein the first buffer layer and the additional buffer layers have a concentration of germanium less than 15 atomic percent.

11. The method of claim 7, further comprising forming an air gap interposed between the source/drain region and the semiconductor substrate.

12. The method of claim 11, wherein a top point of the air gap is lower than a top point of a lowermost body layer of the source/drain region.

13. The method of claim 11, wherein a height of the air gap is in a range of 5 nm to 30 nm.

14. A method of manufacturing a device, the method comprising:
forming a source/drain region in a first semiconductor fin and a second semiconductor fin, the forming the source/drain region comprising:
epitaxially growing a first portion of a first body layer in the first semiconductor fin and a second portion of the first body layer in the second semiconductor fin;
epitaxially growing a first portion of a first buffer layer on the first portion of the first body layer and a second portion of the first buffer layer on the second portion of the first body layer;
epitaxially growing a second body layer on the first buffer layer, the second body layer being a single continuous material, wherein the second body layer is free of facets;
epitaxially growing a second buffer layer on the second body layer;
epitaxially growing a third body layer on the second buffer layer;
epitaxially growing a third buffer layer on the third body layer; and
removing lateral portions of the third body layer and the third buffer layer with a first etch back process.

15. The method of claim 14, further comprising:
epitaxially growing a fourth body layer on the third buffer layer;
epitaxially growing a fourth buffer layer on the fourth body layer; and
removing lateral portions of the fourth body layer and the fourth buffer layer with a second etch back process.

16. The method of claim 14, wherein the first buffer layer has an average thickness in a range of 2 Å to 30 Å.

17. The method of claim 14, wherein the first etch back process is a dry etch performed with a gas comprising HCl.

18. The method of claim 14, wherein the first etch back process is performed at a temperature in a range of 400° C. to 700° C.

19. The method of claim 14, wherein the first etch back process is performed for a duration in a range of 20 seconds to 600 seconds.

20. The method of claim 14, wherein the third body layer is below a top surface of the second semiconductor fin.

* * * * *